(12) United States Patent
Gurdan et al.

(10) Patent No.: US 11,585,658 B2
(45) Date of Patent: Feb. 21, 2023

(54) VIRTUAL SENSOR AND COMPASS CALIBRATION

(71) Applicant: Intel Corporation, Santa Clara, CA (US)

(72) Inventors: Tobias Gurdan, Germering (DE); Daniel Gurdan, Germering (DE)

(73) Assignee: Intel Corporation, Santa Clara, CA (US)

( * ) Notice: Subject to any disclaimer, the term of this patent is extended or adjusted under 35 U.S.C. 154(b) by 826 days.

(21) Appl. No.: 16/455,782

(22) Filed: Jun. 28, 2019

(65) Prior Publication Data

US 2019/0323839 A1 Oct. 24, 2019

(51) Int. Cl.
| | | |
|---|---|---|
| *G01C 17/38* | (2006.01) | |
| *B64C 39/02* | (2006.01) | |
| *G01C 17/02* | (2006.01) | |
| *G01R 33/02* | (2006.01) | |
| *G01C 21/10* | (2006.01) | |

(52) U.S. Cl.
CPC ............ *G01C 17/38* (2013.01); *B64C 39/024* (2013.01); *G01C 17/02* (2013.01); *G01C 21/10* (2013.01); *G01R 33/02* (2013.01); *B64C 2201/145* (2013.01)

(58) Field of Classification Search
CPC ........ G01C 17/38; G01C 17/02; G01C 21/10; B64C 39/024; B64C 2201/145; G01R 33/02
See application file for complete search history.

(56) References Cited

U.S. PATENT DOCUMENTS

| | | | |
|---|---|---|---|
| 2014/0032154 A1* | 1/2014 | Peng ................... | G01C 17/38 |
| | | | 702/104 |
| 2018/0024571 A1* | 1/2018 | Peasgood ............. | G01C 25/005 |
| | | | 244/70 |
| 2018/0112980 A1* | 4/2018 | Diem ................... | G01C 17/38 |

* cited by examiner

*Primary Examiner* — Hunter B Lonsberry
*Assistant Examiner* — Harrison Heflin
(74) *Attorney, Agent, or Firm* — Viering, Jentschura & Partner mbB

(57) ABSTRACT

An unmanned aerial vehicle includes one or more magnetometers, configured to detect a magnetic field and to output magnetometer data corresponding to a magnitude of the detected magnetic field; a position sensor, configured to detect a position of the unmanned aerial vehicle relative to one or more reference points, and to output position sensor data representing the detected position; one or more processors, configured to control the unmanned aerial vehicle to rotate about its z-axis; receive magnetometer data comprising a plurality of z-axis directional measurements taken during the rotation about the z-axis; receive position sensor data and determine from at least the position sensor data a magnetic field inclination of the detected position; and determine a z-axis magnetometer correction value as a difference between the received magnetometer data for the z-axis and the determined magnetic field inclination.

6 Claims, 16 Drawing Sheets

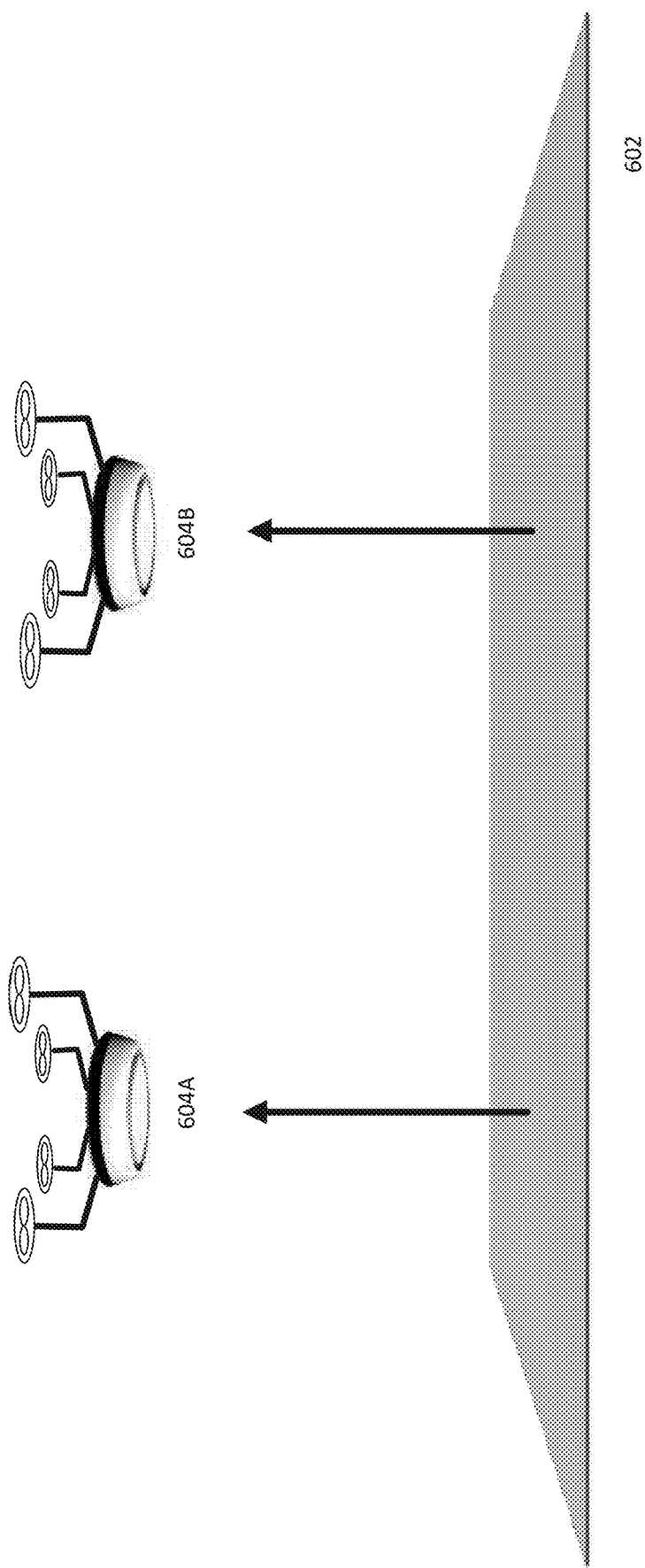

VIRTUAL SENSOR AND COMPASS CALIBRATION

TECHNICAL FIELD

Exemplary implementations described herein generally relate to a virtual heading sensor using acceleration data and data from a position sensor. The results of the virtual heading sensor may be used to detect and/or correct errors in an unmanned aerial vehicle's (UAV's) compass.

BACKGROUND

UAVs are typically equipped with a compass, which plays a crucial role in UAV navigation. Compass calibration is necessary to maintain control and stability of the UAV during flight. Known methods of compass calibration generally involve a cumbersome process of manually rotating the UAV about a variety of axes.

UAVs may be utilized alone or in combination with other UAVs. For some purposes, UAVs may be deployed in large fleets. UAV light shows may be an example of a UAV task for which a large fleet is utilized. UAV light shows can utilize hundreds, or even thousands, of UAVs. Manual calibration methods are time-consuming and cumbersome, and they generally need to be individually performed on each member of the UAV fleet. This demands significant resources of time and labor. Moreover, it is often very difficult to identify within a fleet the specific UAVs that require calibration. Thus may result in the need for time-consuming, brute force calibration of the entire fleet.

BRIEF DESCRIPTION OF THE DRAWINGS

Throughout the drawings, it should be noted that like reference numbers are used to depict the same or similar elements, features, and structures. The drawings are not necessarily to scale, emphasis instead generally being placed upon illustrating aspects of the disclosure. In the following description, some aspects of the disclosure are described with reference to the following drawings, in which:

FIG. 6 depicts a rotational maneuver for UAV calibration.

DESCRIPTION

Figure 1:
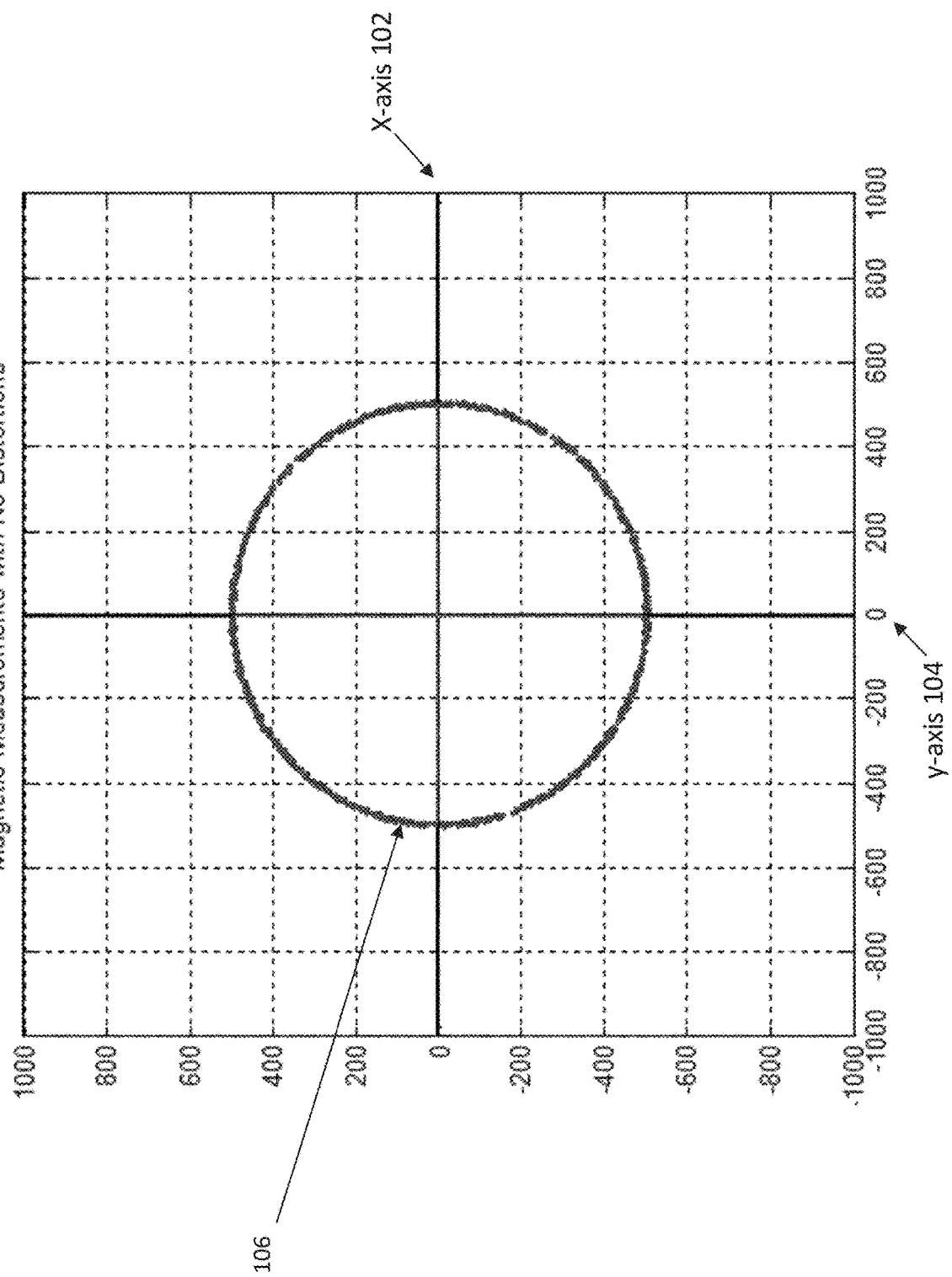
FIG. 1 depicts a two-axis representation of magnetic measurements with no distortions.

The following detailed description refers to the accompanying drawings that show, by way of illustration, specific details and aspects in which the disclosure may be practiced. These aspects are described in sufficient detail to enable those skilled in the art to practice the disclosure. Other aspects may be utilized and structural, logical, and electrical changes may be made without departing from the scope of the disclosure. The various aspects are not necessarily mutually exclusive, as some aspects can be combined with one or more other aspects to form new aspects. Various aspects are described in connection with methods and various aspects are described in connection with devices. However, it may be understood that aspects described in connection with methods may similarly apply to the devices, and vice versa.

The word "exemplary" is used herein to mean "serving as an example, instance, or illustration." Any aspect of the disclosure described herein as "exemplary" is not necessarily to be construed as preferred or advantageous over other aspects of the disclosure.

Throughout the drawings, it should be noted that like reference numbers are used to depict the same or similar elements, features, and structures.

The terms "at least one" and "one or more" may be understood to include a numerical quantity greater than or equal to one (e.g., one, two, three, four, [ . . . ], etc.). The term "a plurality" may be understood to include a numerical quantity greater than or equal to two (e.g., two, three, four, five, [ . . . ], etc.).

The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The words "plural" and "multiple" in the description and the claims expressly refer to a quantity greater than one. Accordingly, any phrases explicitly invoking the aforementioned words (e.g. "a plurality of [objects]", "multiple [objects]") referring to a quantity of objects expressly refers more than one of the said objects. The terms "group (of)", "set [of]", "collection (of)", "series (of)", "sequence (of)", "grouping (of)", etc., and the like in the description and in the claims, if any, refer to a quantity equal to or greater than one, i.e. one or more. The terms "proper subset", "reduced subset", and "lesser subset" refer to a subset of a set that is not equal to the set, i.e. a subset of a set that contains less elements than the set.

The term "data" as used herein may be understood to include information in any suitable analog or digital form, e.g., provided as a file, a portion of a file, a set of files, a signal or stream, a portion of a signal or stream, a set of signals or streams, and the like. Further, the term "data" may also be used to mean a reference to information, e.g., in form of a pointer. The term data, however, is not limited to the aforementioned examples and may take various forms and represent any information as understood in the art.

The term "processor" or "controller" as, for example, used herein may be understood as any kind of entity that allows handling data, signals, etc. The data, signals, etc. may be handled according to one or more specific functions executed by the processor or controller.

A processor or a controller may thus be or include an analog circuit, digital circuit, mixed-signal circuit, logic circuit, processor, microprocessor, Central Processing Unit (CPU), Graphics Processing Unit (GPU), Digital Signal Processor (DSP), Field Programmable Gate Array (FPGA), integrated circuit, Application Specific Integrated Circuit (ASIC), etc., or any combination thereof. Any other kind of implementation of the respective functions, which will be described below in further detail, may also be understood as a processor, controller, or logic circuit. It is understood that any two (or more) of the processors, controllers, or logic circuits detailed herein may be realized as a single entity with equivalent functionality or the like, and conversely that any single processor, controller, or logic circuit detailed herein may be realized as two (or more) separate entities with equivalent functionality or the like.

The term "system" (e.g., a drive system, a position detection system, etc.) detailed herein may be understood as a set of interacting elements, the elements may be, by way of example and not of limitation, one or more mechanical components, one or more electrical components, one or more instructions (e.g., encoded in storage media), one or more controllers, etc.

The term "position" used with regard to a "position of an unmanned aerial vehicle", "position of an object", "position of an obstacle", and the like, may be used herein to mean a point or region in a two- or three-dimensional space. It is understood that suitable coordinate systems with respective reference points are used to describe positions, vectors, movements, and the like.

The term "map" used with regard to a two- or three-dimensional map may include any suitable way of describing positions of objects in the two- or three-dimensional space.

According to various aspects, a voxel map may be used to describe objects in the three dimensional space based on voxels associated with objects. To prevent collision based on a voxel map, ray-tracing, ray-casting, rasterization, etc., may be applied to the voxel data.

A "circuit" as user herein is understood as any kind of logic-implementing entity, which may include special-purpose hardware or a processor executing software. A circuit may thus be an analog circuit, digital circuit, mixed-signal circuit, logic circuit, processor, microprocessor, Central Processing Unit ("CPU"), Graphics Processing Unit ("GPU"), Digital Signal Processor ("DSP"), Field Programmable Gate Array ("FPGA"), integrated circuit, Application Specific Integrated Circuit ("ASIC"), etc., or any combination thereof. Any other kind of implementation of the respective functions which will be described below in further detail may also be understood as a "circuit." It is understood that any two (or more) of the circuits detailed herein may be realized as a single circuit with substantially equivalent functionality, and conversely that any single circuit detailed herein may be realized as two (or more) separate circuits with substantially equivalent functionality. Additionally, references to a "circuit" may refer to two or more circuits that collectively form a single circuit.

As used herein, "memory" may be understood as a non-transitory computer-readable medium in which data or information can be stored for retrieval. References to "memory" included herein may thus be understood as referring to volatile or non-volatile memory, including random access memory ("RAM"), read-only memory ("ROM"), flash memory, solid-state storage, magnetic tape, hard disk drive, optical drive, etc., or any combination thereof. Furthermore, it is appreciated that registers, shift registers, processor registers, data buffers, etc., are also embraced herein by the term memory. It is appreciated that a single component referred to as "memory" or "a memory" may be composed of more than one different type of memory, and thus may refer to a collective component including one or more types of memory. It is readily understood that any single memory component may be separated into multiple collectively equivalent memory components, and vice versa. Furthermore, while memory may be depicted as separate from one or more other components (such as in the drawings), it is understood that memory may be integrated within another component, such as on a common integrated chip.

The word "compass" may refer to any device that is capable of directionally detecting and/or measuring a magnetic field. The compass may specifically refer to a magnetometer, which may measure the strength and direction of one or more magnetic fields. The measurements of the compass may be made according to any, or any combination, of the three physical axes (x-axis, y-axis, and/or z-axis). The compass measurements may include a combination of the earth's magnetic field and any local magnetic field or fields. The word compass may specifically refer to a compass on a printed circuit boards ("Compass PCB"). Such a Compass PCB may be referred to alone, or as part of a compass system for a UAV.

The word Inertial Measurement Unit ("IMU") may refer to any device or devices that measure a body's specific force, angular rate, and/or magnetic field. The IMU may include any of one or more accelerometers, one or more gyroscopes, one or more magnetometers, one or more compasses, or any combination thereof.

UAVs that rely on external positioning systems such as the Global Positioning System (GPS) and/or radio localization systems must be able to correctly determine their heading in world coordinates to function properly. GPS and radio localization systems may provide sufficient information to derive a position along XYZ coordinates by localizing an antenna with high positioning noise, so that the antenna's XYZ position can be derived from the measurement; however, it is generally not possible to use multiple antennas to determine the UAV's heading due to the high noise and limited possible distance between multiple antennas on a UAV, which is typically small in diameter. Although GPS and radio localization systems may provide sufficient information to derive a position along XYZ coordinates, they may not, in isolation, provide a sufficiently accurate source of heading information.

In indoor environments, a magnetic field sensor ("compass") is likely to deliver false or inaccurate measurements, often due at least to steel and other ferromagnetic materials in walls, ceilings, furniture, etc. In outdoor environments, a compass may sometimes be able to determine a UAV's heading with some accuracy; however, the compass can also show erroneous heading measurements. Such erroneous heading measurements can result from instances when a UAV's launch site contains metal or other ferromagnetic materials, or in electromagnetic interference, which can also occur during flight. Accordingly, it is desirable to detect and compensate for compass measurement error.

Efforts have been made to compensate for the compass's deficiencies by using optical tracking solutions. In this manner, the optical tracking elements are placed with multiple markers on each UAV, which permits determination of heading. These systems tend to be expensive and require a direct line of sight, which can be very limiting. Furthermore, they tend to have a limited field of view. These factors make them a poor choice at least for indoor applications and applications for which the additional expense of an optical tracking solution is undesirable.

It is also known to pre-set a UAV to a particular heading before launch and to subsequently rely on the IMU data to adjust the pre-set heading information without a further, measured update. Although this may provide a short-term source of heading information, the estimated heading will eventually drift due to measurement errors. Thus, although it may temporarily work, it is not a robust solution.

Moreover, there are various methods available to calibrate the UAV by manually collecting measurements. Each of these methods requires that the UAV be manually rotated about multiple axes, either in steps or continuously. These data are then used to compute a calibration factor. As will be discussed in greater detail, many solutions only compensate for bias (e.g. hard iron) and scale errors, but not for soft iron effects.

Herein are disclosed more robust calibration strategies that use IMU measurements while correlating them with positioning information from the external tracking system or GPS to determine an estimate of the UAV's true heading. The result of this advanced data fusion can then be used as a source for a measurement update in a Kalman Filter, which estimates the UAV's attitude state. In this manner, this fusion data simulate an additional sensor. This may yield a robust pose estimate, including heading and gyro bias estimation. This robust pose estimate can be performed without using a compass. Alternatively, this robust pose estimate can be performed, and the resulting calculation can be compared to a compass's data to estimate the compasses' directional measurement error.

These techniques may have significant impact for indoor UAV light shows, since UAVs in indoor light shows perform better when not using a compass at all but rather when using a virtual sensor, and are thus generally more reliable and can be used in a wider range of applications. Accordingly, the principles and methods of a virtual sensor disclosed herein can be used to generally perform the functions of a compass. That is, UAVs without a compass may operate using the virtual system described herein. UAVs equipped with a compass may operate using the system described herein as a replacement for the compass or in addition to the compass. Although much attention is devoted herein to compass calibration, the virtual sensor may instead function as a compass replacement or compass supplement. In outdoor applications, the robust heading estimation techniques described herein improve performance at least by correcting for electromagnetic compass interference when airborne. Furthermore, these techniques permit for essentially automatic, inflight compass calibration.

The techniques disclosed herein may be enhanced by gathering data from a plurality of UAVs on one or more processors. These data may be used to build a model, which represents the current state of all devices. Assuming some standard behavior, the system may then detect any outliers and inform, sort-out, or recalibrate the relevant UAVs efficiently in batches. In certain configurations, this can be performed fully automatically.

Hard Iron Distortions and Soft Iron Distortions, Generally

To ensure reliable measurement of the UAV, the UAV's magnetic field sensors must be calibrated. Such sensors are subject to component-specific bias and scale errors. In addition, they are negatively affected by objects that produce a magnetic field. This phenomenon of magnetic field-producing objects interfering with compass operation may be known as hard iron distortions. In addition, the compass may be negatively affected by ferromagnetic material, such as e.g. nickel or iron, in the vicinity of the UAV. Even when the ferromagnetic material does not produce its own magnetic field, its presence may interrupt or distort another magnetic field, which may negatively affect the compass readings. This is referred to as soft iron distortion.

A component specific bias will shift the origin of the measurement sphere (much like hard iron distortions). A scale drift will distort the sphere to an axis-symmetrical ellipsoid. A soft iron distortion will cause an arbitrary ellipsoid, which does not necessarily align with the sensor axis.

Common sources of hard iron distortions include speakers or pieces of magnetized iron. If a piece of magnetic material is physically attached to the same reference frame as the sensor, then the magnetic material will create a hard iron distortion that will result in a permanent bias in the sensor output.

In contrast, soft iron distortions are understood to be deflections or alterations in the existing magnetic field. These distortions will stretch or distort the magnetic field depending upon which direction the field acts relative to the sensor. This type of distortion is commonly caused by metals such as nickel and iron. In most cases, hard iron distortions will have a much larger contribution to the total uncorrected error than soft iron.

It is known to correct for hard and soft iron distortions by taking compass measurements during a yaw rotation and to plot the output of the magnetometer on a 2D graph. Assuming no hard or soft iron distortions, the compass measurements should generally form a circle with its midpoint at $X=0$, $Y=0$. The magnitude of the magnetic field corresponds to the radius of the circle. Hard iron distortions will cause a permanent bias to be present in the outputs. The effect of hard iron distortions on the plot will be to shift the center of the circle.

FIG. 1 depicts a two-axis representation of magnetic measurements with no distortions. The compass may be configured to measure the magnitude of magnetic fields in one or more of an x-axis, a y-axis, and/or a z-axis. In this figure, a device with the compass (e.g. a UAV) is rotated about its yaw axis or z-axis. During this rotation, the compass measurements for the x-axis and the y-axis are logged. These results are then plotted along a two-dimensional graph depicting the x-axis 102 and the y-axis 104.

In an ideal situation in which neither hard iron distortions nor sort iron distortions are present, the resulting data plots will resemble a circle 106, whose center point is along the origin (intersection of the x-axis and the y-axis), as depicted herein.

Figure 2:
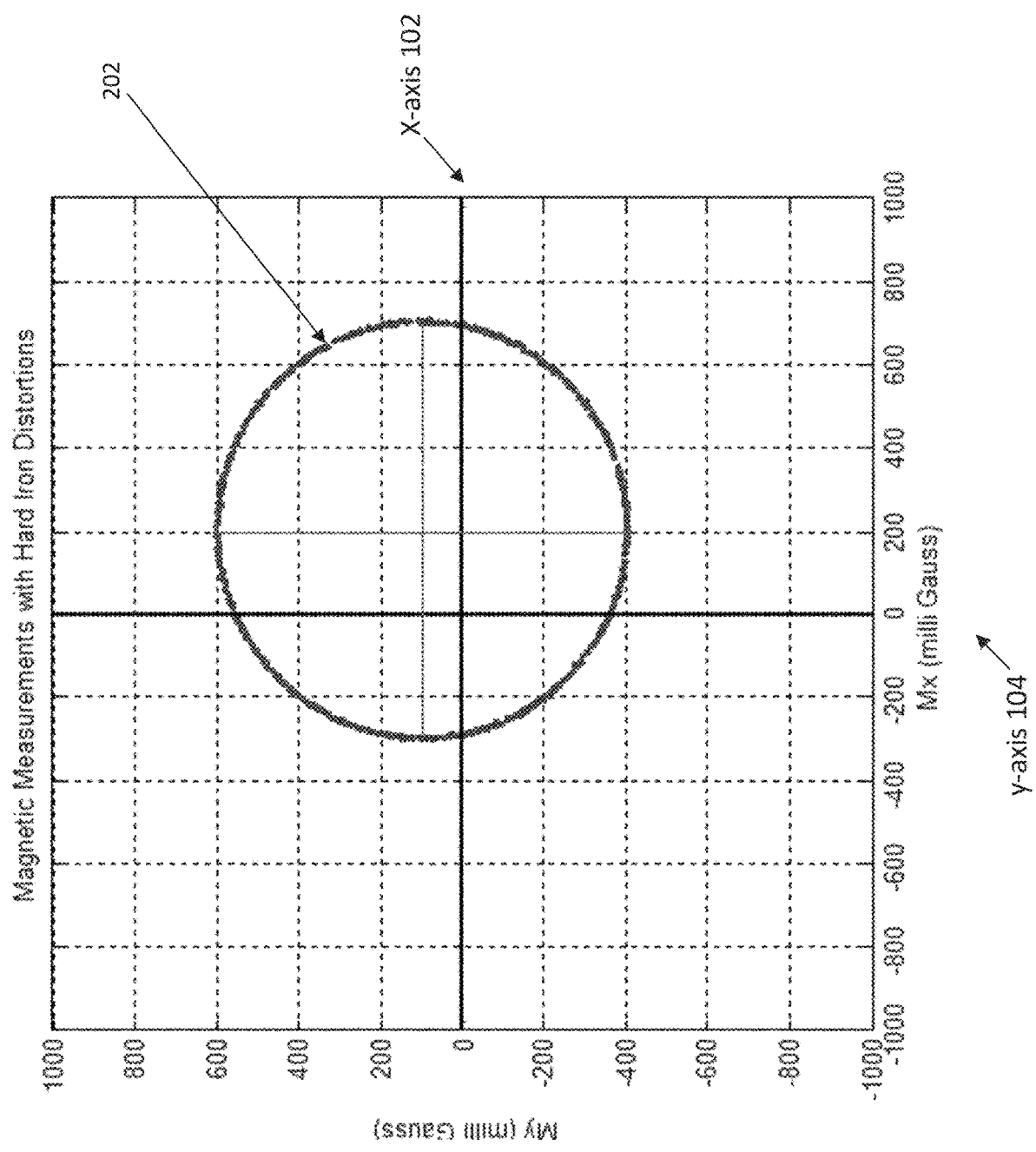
FIG. 2 depicts a two-axis representation of magnetic measurements with hard iron distortions.

FIG. 2 depicts a two-axis representation of magnetic measurements with hard iron distortions. As in FIG. 1, the device with the compass is rotated about its z-axis; the resulting x-axis and y-axis readings of the compass are logged; and the results are plotted. In this case, however, and in contrast to the situation depicted in FIG. 1, the center of the circle is shifted to the point corresponding to $x=200$ and $y=100$, thus, upward and to the right 202. From this, it can be concluded that there is 200 mGauss hard iron bias in the x-axis and 100 mGauss hard iron bias in the y-axis. With this information, a calibration factor for the compass can be determined. In this case, one or more processors may be configured to calibrate received compass data to account for and correct the 200 mGauss hard iron bias in the x-axis and the 100 mGauss hard iron bias in the y-axis. Depending on the configuration, the compass may be calibrated, such that its output data has been corrected for the x-axis and y-axis biases.

One characteristic of hard iron distortions is that they shift the center point of the circle away from the origin while leaving the shape of the circle unchanged. Thus, a measurement plot for a device with a hard iron disturbance only with appear to be a circle whose midpoint is shifted away from the origin.

Figure 3:
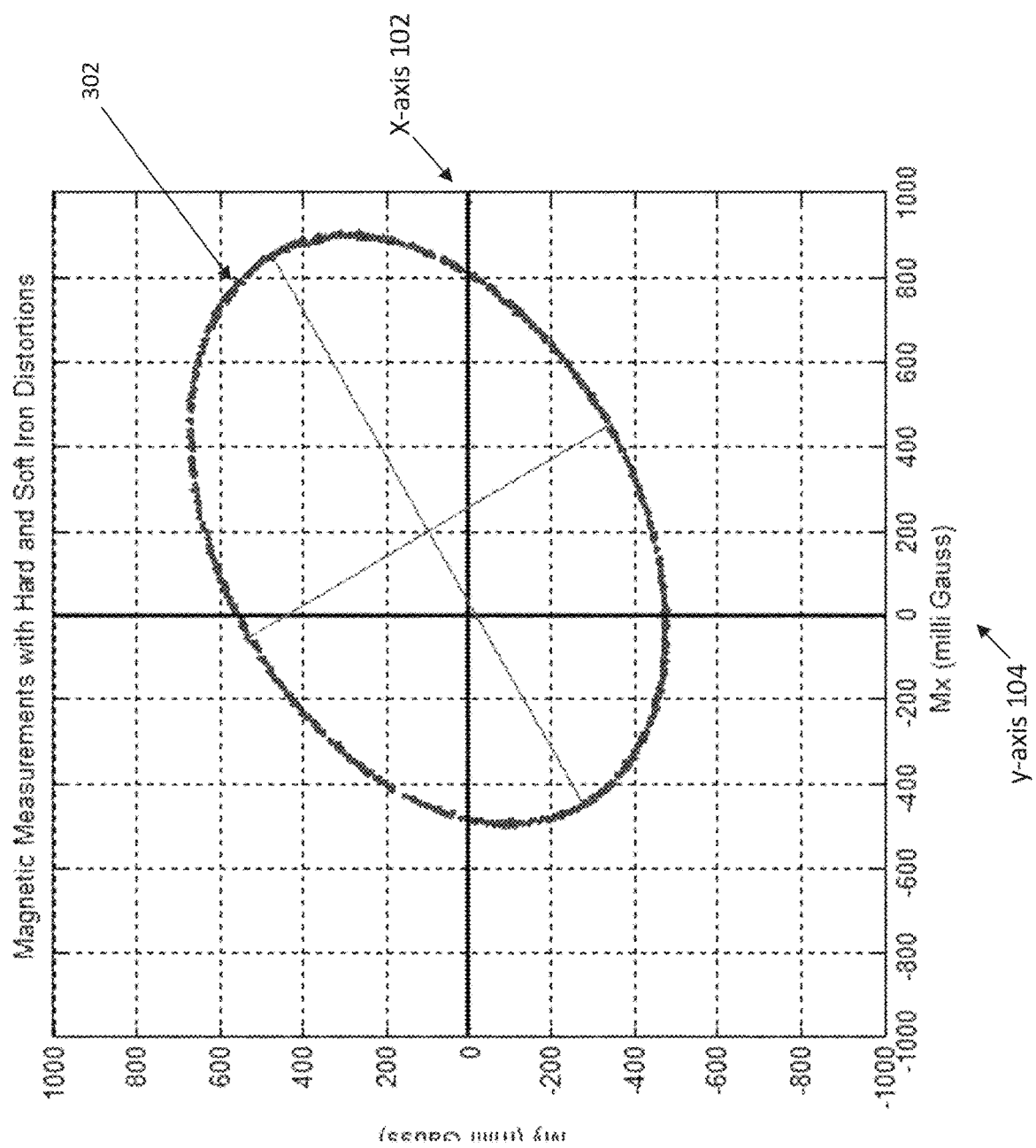
FIG. 3 depicts a two-axis representation of magnetic measurements with hard iron and soft iron distortions.

FIG. 3 depicts a two-axis representation of magnetic measurements with hard iron distortions and soft iron distortions. In contrast to hard iron distortions, soft iron distortions distort and warp the existing magnetic field, thereby changing the shape of the plotted results from being circular to elliptical. As shown in FIG. 3, the circle has been distorted into an ellipse 302. The center of the ellipse is still located at X=200 and Y=100 m, which correspond to the hard iron distortions previously identified in FIG. 2. Every ellipse has a major axis and minor axis, which correspond to the long and short dimensions respectfully. As shown in the above plot the ellipse has its major axis aligned 30 degrees up from the body frame X direction.

A component specific bias will shift the origin of the measurement sphere similarly to how a hard iron distortion shifts the origin of the measurement sphere. In contrast, a scale drift will distort the sphere to an axis-symmetrical ellipsoid. A soft iron distortion causes an arbitrary ellipsoid, which does not necessarily align with the sensor axis. In this manner, the above measurements can be used to determine and correct for hard iron distortions, soft iron distortions, and scale drift. With respect to FIG. 3, and in addition to the hard iron distortion already identified, the measurements form an axis-symmetrical ellipsoid, which indicates soft iron distortion. From these data, one or more processors may determine a sensor calibration factor to correct the received compass data. Alternatively or additionally, the compass may be directly calibrated such that its outputted data already account for the hard iron and soft iron biases.

In light of the above discussion with respect to hard iron distortion and soft iron distortion, attention is now turned toward the effect of said distortion in an UAV.

UAVs are often equipped with compasses configured as a Compass PCB. Each Compass PCB undergoes a factory compass calibration before being inserted into the UAV. During the factory compass calibration, the compass PCB is rotated about all axes to measure excitation of all sensor axes and to fit a unit-sphere into the data using a least-square fitting algorithm. This procedure is intended to compensate for component-specific bias and any scale errors. This factory compass calibration procedure can be performed with multiple compass PCBs at a time.

Once this procedure is performed, the compass PCB is inserted into the UAV. Various components within the UAV, such as e.g., the UAV battery or other components in the vicinity of the compass, are likely to create new soft iron distortions which were not present during the factory calibration. These soft iron distortions result in diminished accuracy of compass PCB readings, as the compass PCB has been configured for accurate readings in an environment absent these soft iron distortions. Furthermore, the UAV components create time-variant hard iron distortions. Said hard iron distortions can result from, for example, motor currents that are required for the UAV to hover or locomote. These hard iron distortions also reduce the accuracy of the compass PCB, as the compass PCB is calibrated for an environment without said hard iron distortions. Furthermore, the hard iron distortions may vary over time. For example, the current provided to the motor may change based on, for example, a desired velocity or acceleration. These changes in currents can result in changing hard iron distortions.

Combining Data Sources for Heading Detection: Accelerometer and Position System Data Instead of relying on manual rotation along at least the x-axis, y-axis, and the z-axis, compass calibration may be achieved by fusing data from at least two data sources during acceleration. The first data source may be one or more IMU components. According to one aspect of the disclosure, the first data source may be one or more IMU accelerometers. The first data source may detect the direction and magnitude of acceleration in vehicle frame. The first data source may detect said information by determining the direction and/or magnitude of the acceleration vector.

The second source may be a positioning system or a radio tracking system configured to detect position data. According to one aspect of the disclosure, the positioning system may be the Global Positioning System, GLONASS, Galileo, Beidou Navigation System, the Indian Regional Navigation Satellite System, or any other positioning system capable of providing world-frame positioning information, without limitation. The position information can be measured and logged over time. One or more processors may be configured to obtain the second derivative of the position information, which yields acceleration of the UAV in a world-frame. This permits computation of the direction and magnitude of the acceleration vector.

Having determined the acceleration vectors from each of the first data source and the second data source, both vector directions are then compared. Any difference in direction of the vectors corresponds to the vehicles' heading in the world-frame. That is, the direction component of the acceleration vector from the first data source incorporates heading data, since the direction will be relative to a point of reference (e.g. the front of the UAV). The direction component of the acceleration vector from the second data source is based on change in position, without respect to heading. As such, any difference in direction in the two acceleration vectors is expected to reflect the UAV's heading.

The acceleration vector measurements may be weighted by a measurement quality estimate derived from the lengths of both measured acceleration vectors. The greater the acceleration, the more reliable the measurement. The weighted difference may be used as a measurement for a simple observer, which is used to smooth the resulting heading estimate. The output of this observer can then be used in the attitude fusion as a virtual heading sensor, in the same way a real sensor would be used. That is, the heading that is determined as a difference between these determined acceleration vectors may be used alone as the UAV's heading, may be used as a basis to correct or calibrate the compass's heading data, may be fused with the compass's heading data to bolster the reliability of the heading data, or any combination thereof.

Figure 4:
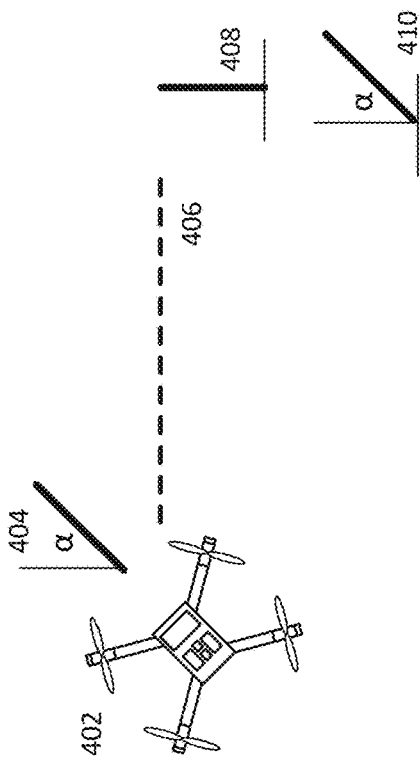
FIG. 4 depicts a linear acceleration maneuver for UAV calibration.

FIG. 4 shows the above calculation of heading using a position system and an accelerometer along a simplified, straight path of travel. A singular device with both a position system and an accelerometer travel along a path. In this figure, the device is configured as a UAV 402. The UAV 402 is facing an unknown heading at angle alpha, as depicted at 404. The UAV 402 accelerates along path 406. During the travel, position data are gathered from the position system, which provide a series of position measurements of the UAV 402 in world-frame. These data are mapped relative to time, and the second derivative is then determined to arrive at the UAV's 402 acceleration. The position data along with the acceleration determination are used to calculate an acceleration vector 408. The acceleration vector 408 includes a direction corresponding to a direction of travel of the UAV 402 without respect to UAV heading, and a magnitude, corresponding to a magnitude of the acceleration.

Additionally, and during the path of travel 406, the UAV's 402 IMU (e.g. accelerometer) may detect the acceleration. The accelerometer may be configured to detect acceleration based on an x-axis accelerative component, a y-axis accelerative component, and/or a z-axis accelerative component. In this example, the path of travel is at a constant altitude or height, and therefore the z-axis component may be neglected. The x-axis component and the y-axis component of acceleration may be resolved to determine an acceleration vector 410. This determined acceleration vector may yield an acceleration vector relative to a direction of reference of the UAV (e.g. a front of the UAV).

The position-determined acceleration vector 408 and the accelerometer-determined acceleration vector 410 may optionally be weighted and/or smoothed. The weighing and/or smoothing can be performed based on any desired data-weighing techniques. According to one aspect of the disclosure, the data may be weighed according to a measurement quality estimate.

The difference between the position-determined acceleration vector 408 and the accelerometer-determined acceleration vector 410 can largely be attributed to the heading of the UAV 402. In this case, the difference between the position-determined acceleration vector 408 and the accelerometer-determined acceleration vector 410 is alpha, which corresponds to the angle of rotation relative to the path of travel 404. The angle alpha may be used relative to the direction of travel to determine an estimated heading of the UAV 402.

By determining the estimated heading, the procedure described herein may be utilized as a virtual IMU sensor and/or a virtual compass. That is, the functions of a compass may be largely fulfilled by detecting IMU acceleration and acceleration from position sensor information. In this manner, a virtual sensor is established.

Additionally or alternatively, the estimated heading of the UAV 402 may be compared with a heading obtained from the UAV's compass for calibration. Any discrepancy between a heading from the UAV's compass and the estimated heading may be resolved through calibration. That is, the x-axis and y-axis of the UAV's compass may be calibrated to resolve any discrepancy between the heading from the UAV's compass and the estimated heading. In this manner, calibration errors resulting from hard iron distortions may be largely resolved or eliminated in the x and y directions.

The procedure described in FIG. 4 utilizes linear acceleration, and thus changes in the current passing to the UAV's motors. This changing current can result in changes of bias or distortions. Accordingly, it may be desirable to determine an estimated UAV heading from a position sensor and accelerometer while traveling at a constant velocity.

Figure 5:
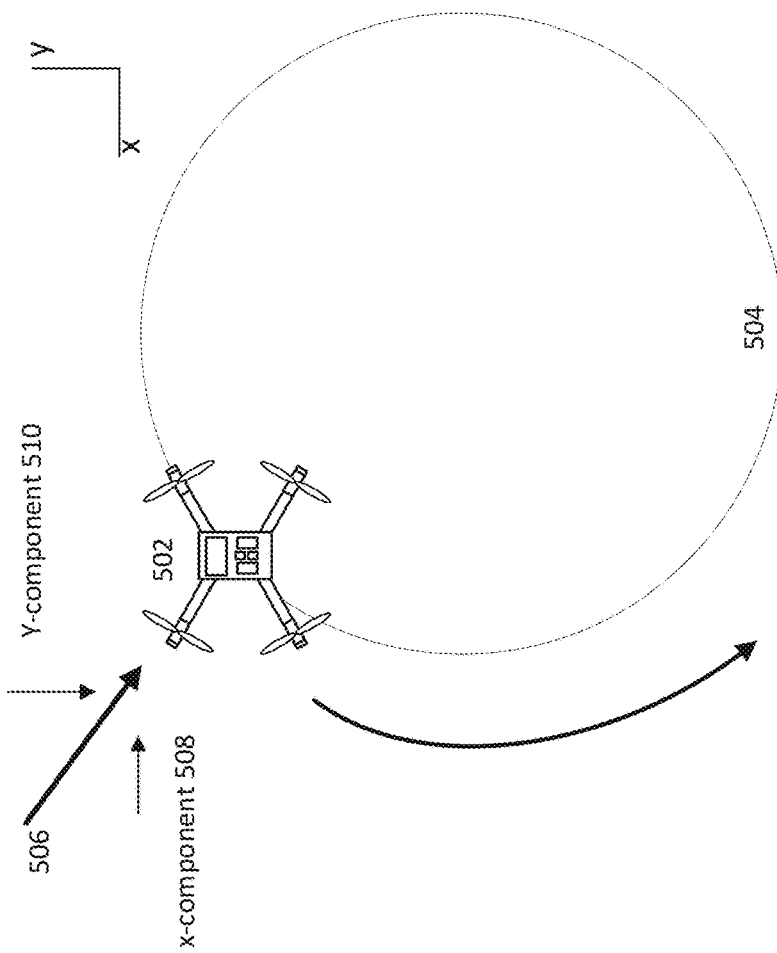
FIG. 5 depicts a rotational maneuver for UAV calibration.

FIG. 5 depicts a procedure for heading estimation using a position sensor and accelerometer at a constant velocity. In this example, a UAV 502 is also equipped with a position sensor and accelerometer. The UAV 502 travels along a generally circular path 504. The duration of travel may optionally include a first portion for acceleration to reach a desired velocity, a second portion at a constant velocity for testing, and a third portion for deceleration. In this manner, the UAV 502 begins accelerating in a generally circular path until it reaches a desired velocity. The desired velocity may be any predetermined velocity, although greater velocities may result in greater accelerometer readings, which may provide additional accuracy. Upon reaching the desired velocity, the testing procedure begins, in which the UAV 502 continues the circular path and travels 360° along the circular path, at which point the conclusion of the testing portion is reached. Following the conclusion of the testing portion, the deceleration phase begins, at which the velocity is decreased. During this phase, the UAV 502 may optionally reach a standstill or may land.

As in FIG. 4, the position sensors detect the UAV's position during the testing phase and deliver data representing the UAV's position in world-frame otherwise relative to one or more fixed points of measurement. These data may be evaluated relative to time to detect a velocity along a point of travel, which may be determined as:

$$v = \frac{2\pi r}{T} \qquad (1)$$

Assuming a constant velocity along the path of travel, the angular acceleration, which may be calculated as:

$$\alpha = \frac{d\omega}{dt} \qquad (2)$$

would be zero. Nevertheless, the IMU will detect acceleration due to change in direction along the circular path, which can be calculated as:

$$a = \frac{v^2}{r} \qquad (3)$$

wherein r is the radius of the path of travel, which is derivable at least from the position data and/or the navigation instruction for this circular maneuver. The vector of acceleration due to change in direction will be toward the center of the circular path of travel and perpendicular to the instantaneous velocity vector. Thus, the magnitude of the acceleration vector may be determined based on the squared velocity divided by the radius of travel, and the direction of the acceleration vector may be determined as being toward the center of travel or perpendicular to the direction of the instantaneous velocity vector.

During the circular path of travel, the accelerometer also measures acceleration in x, y, and z directions. Again, because the path of travel is here assumed to be at a consistent altitude, the z direction can be temporarily disregarded. Assuming a constant velocity during the testing period, the accelerometer data can be assumed to represent the acceleration due to change in direction along the circular path. This may be recorded as an x-component 508 and y-component 510. These components may be combined to determine an instantaneous acceleration vector 506. This acceleration vector may be compared with the derived acceleration vector based on the position information, as calculated above. Any difference between the direction of the acceleration vector as derived from the position data and the direction of the acceleration vector as derived from the accelerometer can be attributed to a heading of the vehicle. With this, the UAV heading may be determined. In this manner, a virtual sensor is formed, in which the UAV heading may be detected in addition to, or in place of, a compass.

In the event that the UAV is equipped with a compass, the derived heading, as described above, may be compared with a compass heading. Any discrepancies between the compass heading and the derived heading may be resolved by compass calibration. In so calibrating, discrepancies based on hard iron distortions may be eliminated. Furthermore, by maintaining a constant velocity along the path of travel, further soft iron discrepancies based on changes in current may also be eliminated.

The virtual heading sensor may optionally be used to determine the compass's directional bias. This can be performed while still utilizing and/or relying on the compass. That is, the compass may be used to obtain measurement, said measurements being subject to interference and/or bias. In contrast, the virtual heading sensor is not subject to interference; however, it only is able to detect reliable data when UAV is accelerating, breaking, changing direction, or flying on a curved trajectory.

In the above description, the creation of a virtual sensor using detected acceleration data were described with respect to linear acceleration and rotational acceleration. The references to linear acceleration and rotational acceleration are provided as examples only, and the procedures described herein are not intended to be limited solely to linear and/or rotational acceleration. It is envisaged, for example, that a UAV may accelerate along a path that is neither linear nor circular. In light of the examples above, it should be appreciated that acceleration may be calculated along whatever path traveled by the UAV, both from an accelerometer and by detecting acceleration from the position sensor data. In this manner, the virtual sensor can be applied to acceleration along any path of travel.

Circular Rotation and Magnetic Field Inclination for Compass Calibration

FIG. 6 depicts a procedure for UAV calibration using a circular rotation of the UAV. One or more UAVs 604A and 604B may be at a resting position on the ground, on a launchpad, or otherwise. The resting surface is depicted herein as 602. The one or more UAVs 604A and 604B may be selected for calibration. The one or more UAVs 604A and 604B may travel upward to a suitable height for the calibration action. The calibration action can be performed at any height above the ground; however, it may be desirable for the one or more UAVs 604A and 604B to reach a height sufficiently far from the ground as to eliminate magnetic interference from the ground. The one or more UAVs 604A and 604B may then perform the calibration action that will be described in the following figure. Once calibration action is complete, the one or more UAVs 604A and 604B may resume their resting position on the resting surface 602, where they may proceed with one or more flight instructions.

Figure 7:
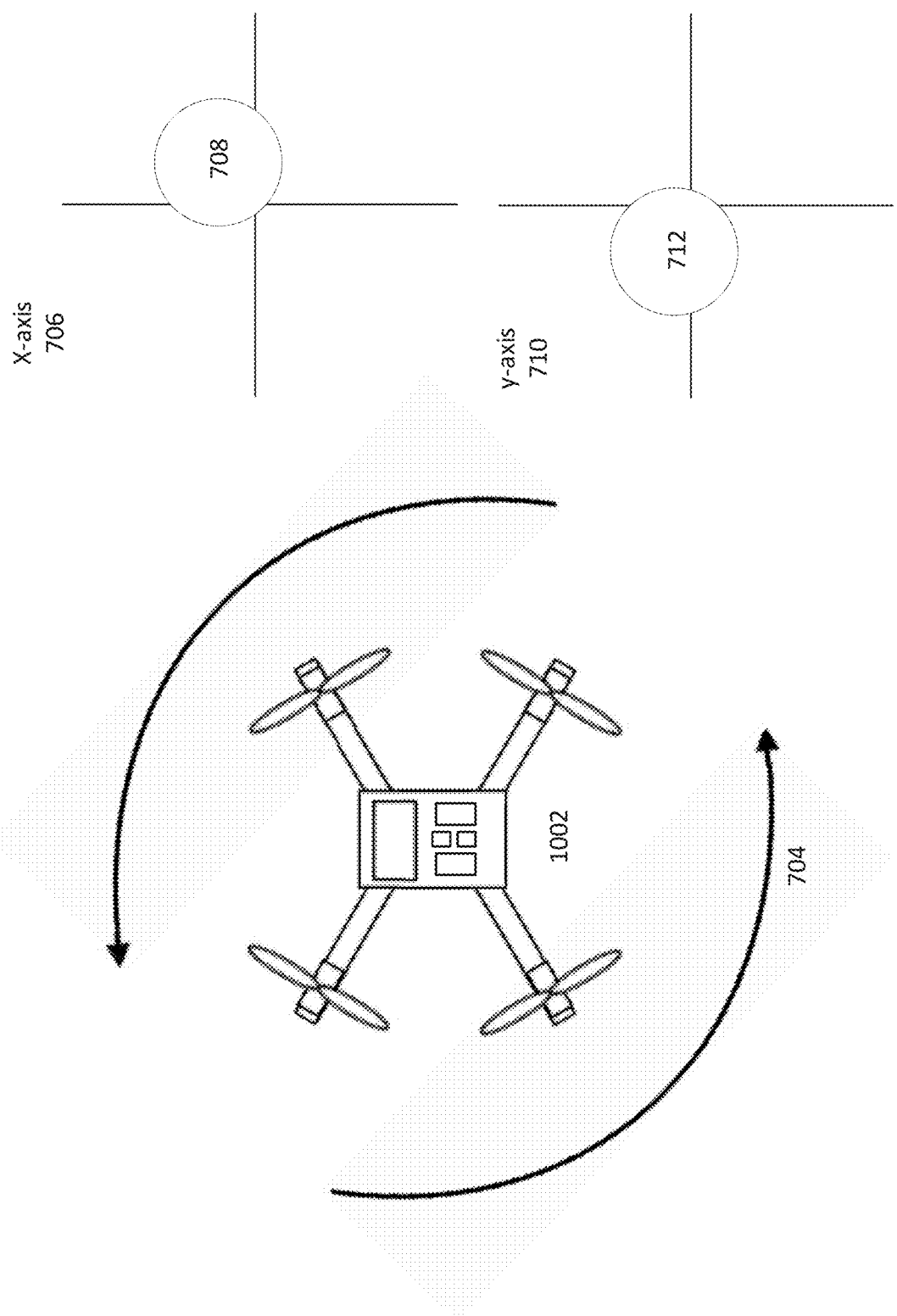
FIG. 7 depicts a rotational maneuver for UAV calibration of an x-axis and y-axis.

FIG. 7 depicts a calibration action according to one aspect of the disclosure. The UAV 702 may perform a rotation around its central axis 704. The rotation may comprise three phases. First, there may be an acceleration phase, in which the UAV 702 accelerates to reach a predetermined testing velocity. The acceleration phase may be characterized by a time duration, a predetermined number of degrees of rotation, reaching a predetermined velocity, or any other standard. According to one aspect of the disclosure, the acceleration phase may require 45° of rotation, such that the first phase lasts from 0° to 45° of rotation, at which time it is anticipated that the UAV will have reached the predetermined testing velocity.

The second phase may be the testing phase. During the testing phase, the UAV 702 may perform a 360° rotation, during which its IMU detects magnetic fields along each of the x-axis, y-axis, and z-axis. The data for each axis may be detected at any period of measurement desired. According to one aspect of the disclosure, data for each of the three axes may be detected every 2° of rotation, thereby resulting in 180 measurements per axis. The measurement period may be more frequent or less frequent, depending on the desired configuration. The testing phase may begin after completion of the acceleration phase. Thus, in the case that the acceleration phase ends upon reaching 45° of rotation, the testing phase may begin at 45° and may concludes at 405°.

The third phase may be the deceleration phase, during which the UAV's rotational velocity is reduced. The deceleration phase may be characterized by any length of time, any number of rotational degrees, reaching a desired velocity, or otherwise. According to one aspect of the disclosure, the deceleration phase may require 45° of additional rotation, thereby beginning the deceleration phase at 405° and ending the deceleration phase at 450°.

The magnetic field data detected by the IMU for each of the x-axis and the y-axis may be mapped as depicted by 706 and 708 for the x-axis and 710 and 712 for the y-axis, respectively, according to the procedures described with respect to FIG. 1 through FIG. 3, such as by inputting the data to a least square ellipsoid fitting algorithm. As a variety of least square ellipsoid fitting algorithms are available, a particular algorithm will not be specified herein. Rather, it is understood that a person skilled in the art may select an appropriate least square ellipsoid fitting algorithm for this task. In so doing, and as described above with respect to FIG. 1 through FIG. 3, soft iron distortions, hard iron distortions, component specific bias, and/or scale drift can be identified and corrected. The parameters of the ellipsoid may be stored in a memory for calibration of the x-axis and the y-axis of the compass. The calibration may be performed on the compass itself, such that he compass's output data reflect the calibration. Alternatively, the calibration may be carried out with one or more processors that are configured to receive the compass data.

Figure 8:
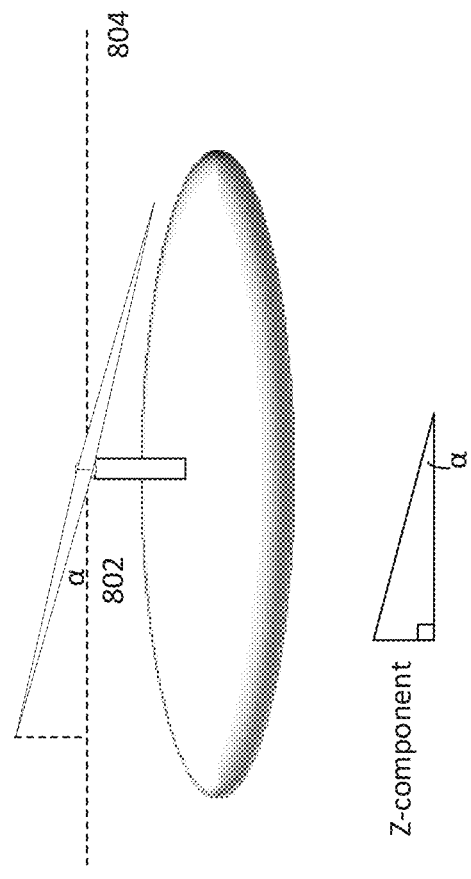
FIG. 8 depicts a magnetic field inclination.

The method described with respect to FIG. 7 addresses only two axes (e.g. the x-axis and the y-axis). It is therefore desired to further calibrate and correct for the z-axis using the rotational movement described above. FIG. 8 depicts a z-axis calibration using the rotational movement from FIG. 7, based on an earth magnetic field inclination. The earth magnetic field inclination, also referred to as magnetic dip, dip angle, or magnetic inclination, is the angle 802 that results between the Earth's magnetic field lines and the horizontal 804. The magnetic field inclination varies based on the location on earth in which the magnetic field inclination is measured. Because the magnetic field inclinations on earth are known, an expected magnetic field inclination can be determined from a known geographic position. The UAV may be configured with a memory on which is stored one or more magnetic field inclination values and their respective geographic locations or coordinates. According to an aspect of the disclosure, the memory may include a lookup table for earth magnetic field inclination values as associated with geographic locations.

Unless the compass is calibrated to account for the magnetic field inclination where the UAV is located, the compass's y-axis readings will reflect a deviation from the horizontal based on the magnetic field inclination of the point on Earth where the compass is located. As stated above with respect to FIG. 7, the UAV may be configured to rotate around its center axis, during which time, the compass detects data for the x-axis, y-axis, and z-axis. Some or all of this data can be stored for later use. The average of the z-axis readings during the testing phase will be generally equal to the vertical component of the earth's magnetic field vector, as offset by any hard iron distortion bias.

The earth magnetic field inclination, which may be thought of as a tilt versus a horizontal plane, may be computed using an earth magnetic field model plus position system time and location. For example, the earth magnetic field inclination in Munich, Germany is approximately 64.8°. Accordingly, the resulting radius of the measurement circle seen in the x-axis and y-axis during the 360° rotation is only 0.42 of a total vector length of 1.0 in the unit sphere. The calculations can be completed using trigonometric principles in conjunction with the determined earth magnetic field inclination for the relevant location.

Because the factory calibration was previously performed, at least during the manufacturing process, it may be assumed that the factory-calibrated scale for the z-axis is the same as that for the x-axis and the y-axis. The z-axis measurements are averaged over each of the received data points, e.g. the one hundred eighty measurements taken during the 360° yaw rotation. The average z-vector is should be the same as the vertical component of the earth's magnetic field vector. As such, any bias caused by hard-iron distortion can be determined using this average z-vector, plus the earth's magnetic field inclination and any in-system sensor scale derived as described in at least FIG. 1 through FIG. 3. Otherwise stated:

$$\text{average } z\text{-vector} = \text{magnetic field inclination} + \text{bias} + \text{sensor scale factor} \quad (4)$$

In light of the foregoing, the known procedure of calibrating the compass by rotating the UAV about all axes on the ground has several deficiencies. First, this method of operation can only be performed when the UAV is stationary, which may require an interruption in UAV activity. Second, although manual rotation of the UAV on the ground may be able to correct for soft iron distortion, as the soft iron distortion would be expected to be generally static, said manual rotation is unlikely or unable to correct for many hard iron distortions, such as those that vary over time, such as the hard iron distortions based on current supplied to the motor. At least for safety reasons, the manual rotation of the UAV about its axes is generally performed when the motor is stationary, thereby eliminating the ability to test for hard iron distortions due to motor current.

Instead of manually rotating the UAV about its axes on the ground, it is proposed herein to utilize an in-flight calibration procedure. The data necessary for such in-flight calibration are gathered during a UAV flight maneuver. According to one aspect of the disclosure, this flight maneuver may be performed while the UAV hovers and rotates at 360° plus additional buffer, which permits gathering of data during a full circle. The data from the rotation may be applied to a full ellipsoid fit, in order to compensate for both hard iron distortions and soft iron distortions. Based on the full ellipsoid fit, an algorithm may estimate an in-system bias based at least on data regarding the calibration location using computed earth magnetic field inclination. Advantageously, this procedure can be performed with little to no manual labor.

The UAV flight maneuver for calibration may be performed at any altitude. Depending on the configuration, it may be convenient to perform the UAV maneuver at a relatively low altitude, to avoid unnecessary UAV travel. It may be preferable to reach a sufficiently high altitude to avoid interference from ground-based objects. According to one aspect of the disclosure, the flight maneuver for calibration may be performed at an altitude of 10 meters above ground level. Any altitude may be selected, depending on the desired configuration.

The UAV flight maneuver for calibration may include a complete circle about the yaw axis of the UAV, plus approximately 45° for the angular acceleration phase, and an additional 45° for the angular deceleration phase at the end of the measurement circle. The angular acceleration phase may be necessary to obtain the desired rotational speed. The total rotation may reach or exceed 450°, wherein data may be sampled from approximately 45° to approximately 405°. Measurements may be taken in a full, unaccelerated 360° rotation. According to one aspect of the disclosure, it may be necessary to perform measurements in an unaccelerated rotation in order for the load distribution to be as close to normal as possible between motors. The calibration algorithm may receive a data point consisting of the x, y, and z compass axes periodically. According to one aspect of the disclosure, the period for receiving the data point may be every 2°, thereby resulting in 180 measurements during the rotation. This period may be adjusted as necessary, whether more frequent or less frequent. The adjustment of said period may be made to reflect a desire to have increased accuracy at the expense of an increased computational load, or the desire to have a decreased computational load at the expense of having decreased accuracy.

Following the completion of the rotation, the sensor data related to the x- and y-axes may be used as input data for a least-square ellipsoid-fitting algorithm. The parameters of the ellipsoid are stored to calibrate the x-axis and the y-axis of the compass at a later point.

With respect to the z-axis, it is not possible to obtain a complete data set, as it is impossible to rotate a UAV along the z-axis 360° during the rotational movement described herein. Rather, this calibration is performed using a different method. Specifically, the calibration is performed by relying on a priori knowledge of the location. This also contemplates that only the x-axis and the y-axis of the UAV compass significantly influence the navigation solution, whereas the z-axis only becomes significant at high tilt angles. Due to this fact, it is possible to compensate in the z-axis for hard iron distortion only, as opposed to performing both a hard iron distortion and soft iron distortion compensation.

Sensor Schematics

Figure 9:
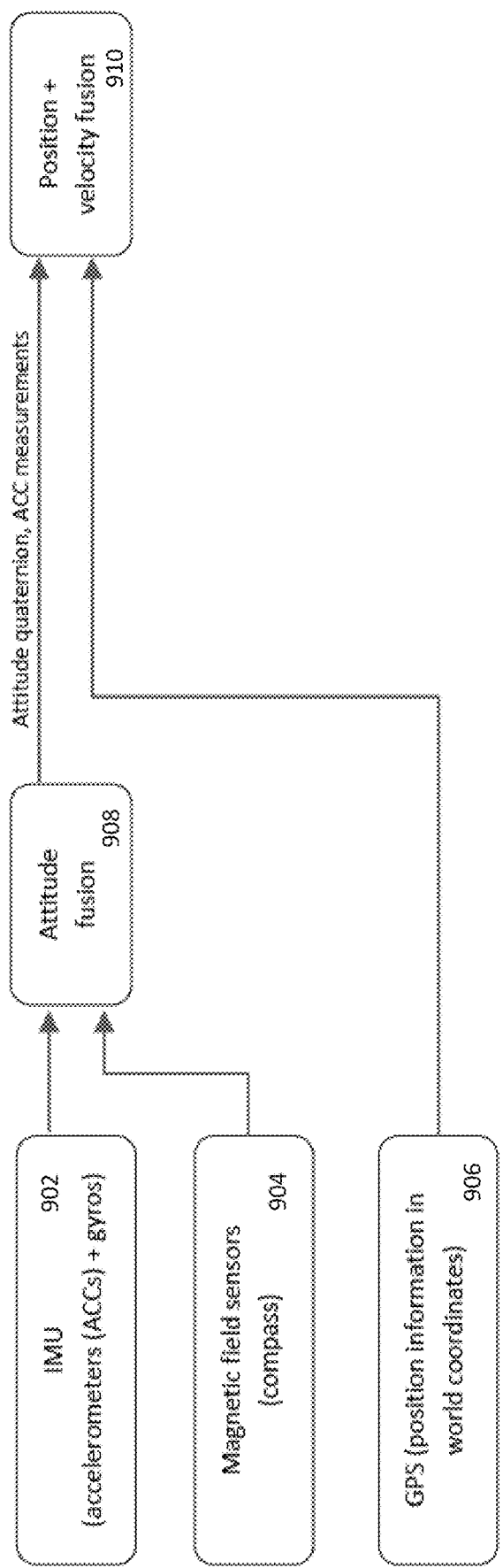
FIG. 9 depicts a sensor schematic.

FIG. 9 is an on-board sensor fusion schematic. In this figure, the UAV is configured with an IMU 902 comprising one or more accelerometers and/or one or more gyroscopes; one or more compasses 904; and a position sensor 906. The IMU 902 data and the compass 904 data may be weighted, resolved, or otherwise fused together to create an attitude fusion 908, which provides a heading or attitude of the UAV. The attitude fusion 908 may be combined with position sensor 906 data to create a position and velocity fusion 910. This system assumes, however, that the compass data is reliable. Where it is suspected or determined that the compass requires calibration, this system, by virtue of its reliance on compass data, may yield unreliable or undesirable results.

Figure 10:
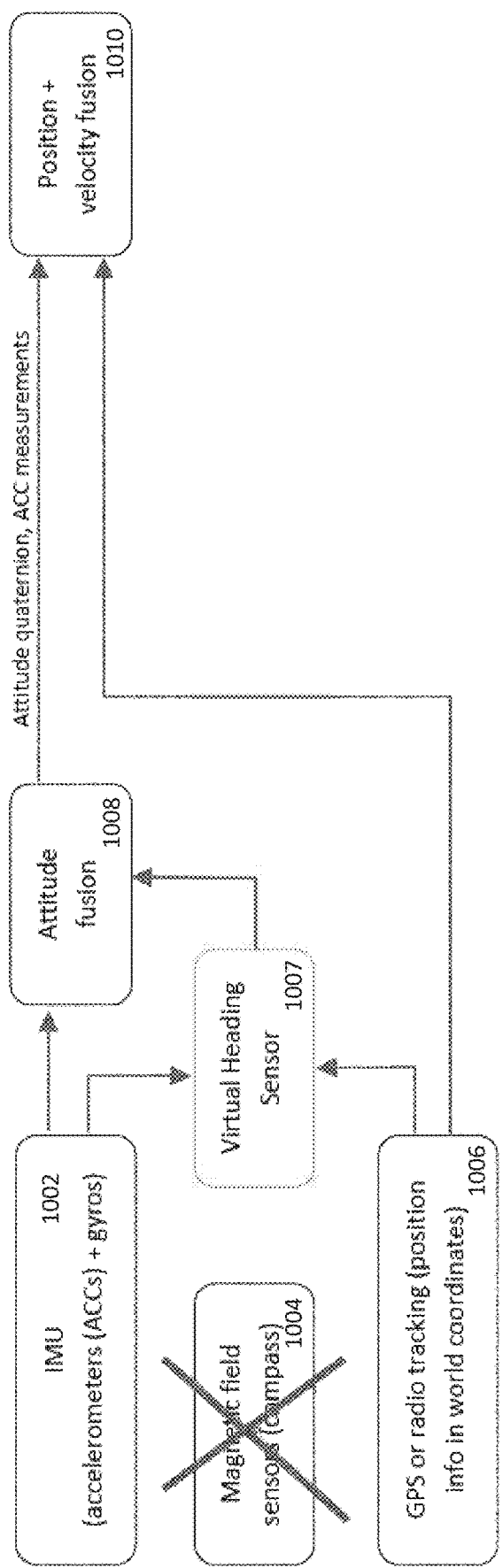
FIG. 10 depicts a sensor schematic with a virtual heading sensor.

FIG. 10 depicts a UAV with sensors as components of a virtual heading sensor. In this figure, the UAV is configured with an IMU 1002 comprising one or more accelerometers and/or one or more gyroscopes; one or more compasses 1004; and a position sensor 1006. The one or more compasses 1004 are deemed to be in need of calibration or otherwise unreliable. As such, the compass data may not be used to determine an attitude. In this case, the IMU 1002 data and position system 1006 data may be combined into a virtual heading sensor 1007 according to the methods and procedures described herein. The resulting virtual heading sensor 1007 data may be combined with IMU 1002 data to determine an attitude fusion 1008. The attitude fusion 1008 may be combined with position system 1006 data to determine a position and velocity fusion 1010.

Figure 11:
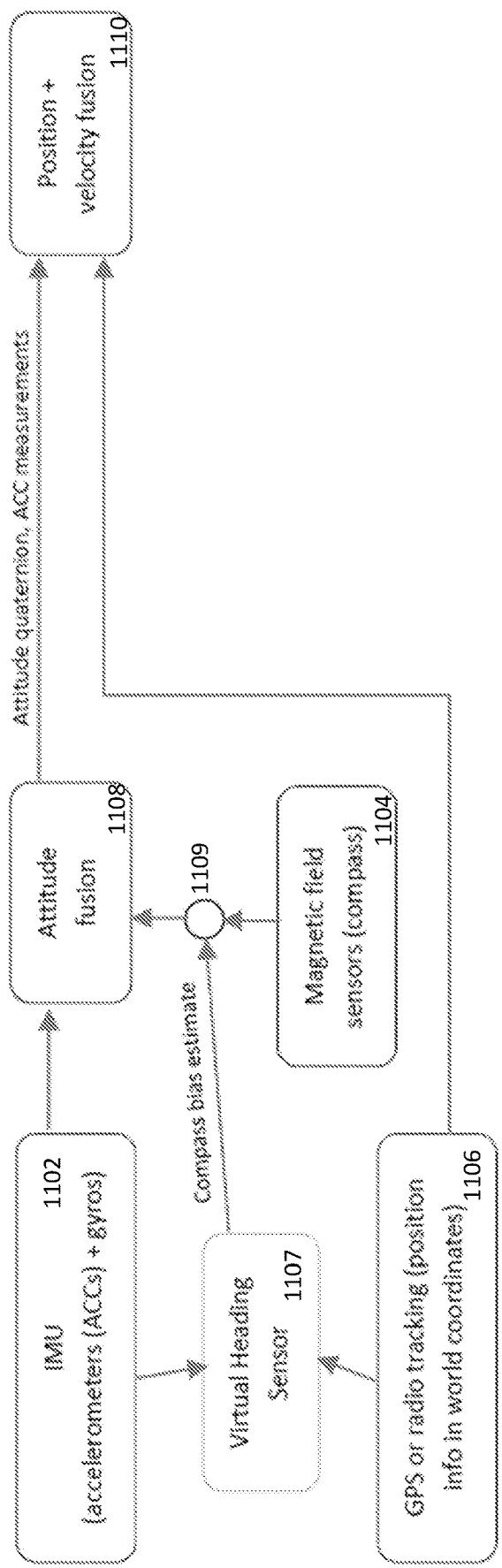
FIG. 11 depicts a sensor schematic with a virtual heading sensor and a compass bias estimate.

FIG. 11 depicts an on-board sensor fusion schematic with a virtual heading sensor and compass bias estimate. In this figure, the UAV is configured with an IMU 1102 comprising one or more accelerometers and/or one or more gyroscopes; one or more compasses 1104; and a position sensor 1106. The IMU data 1102 and the position sensor 1106 data are combined to create a virtual heading sensor 1107. The virtual heading sensor 1107 data include an estimated heading and/or directional vector that is estimated based on data from the IMU 1102 and position sensor 1106 as described herein. The heading and/or directional vector is compared with the compass 1104 data to estimate a compass bias 1109 in the manner described herein. This compass bias estimate 1109 may be used to resolve compass data and/or calibrate the compass. The resolved or corrected compass data may be combined with the IMU 1102 data to create an attitude fusion 1108. The attitude fusion 1108 data may be combined with the position sensor 1106 data to create a position and velocity fusion 1110.

Figure 12:
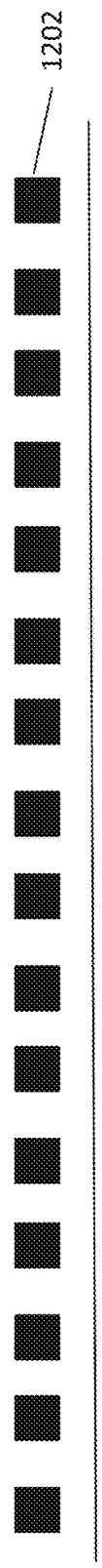
FIG. 12 depicts an array of UAVs and their compass-obtained headings.

FIG. 12 depicts an array of UAVs and their compass-obtained headings. Prior to certain deployments of a fleet of UAVs, the UAVs may be aligned in a unified direction. This may occur, for example, prior to the launching of a UAV light show. Although a UAV light show may involve hundreds, or even thousands, of UAVs, this figure shows a simplified version of sixteen UAVs 1202. Because the UAVs are aligned in the same direction, as is common on many launch pads, the UAVs' compasses will ideally provide the same readings for the x-axis and the y-axis. That is, the compasses will ideally provide the same headings. Deviations in this ideal heading may be due to factors requiring calibration, such as, for example, hard iron distortions and soft iron distortions. By evaluating the magnitude of deviation from the known physical heading, the severity of hard iron distortions and/or soft iron distortions, or otherwise the need for calibration, can be identified. Using this method, a subset of UAVs may be selected, the subset representing the UAVs with the most significant calibration needs.

It is noted that some launch pads are configured to support UAVs that are aligned in rows of more than one direction. For example, some launch pads may have at least a first row of UAVs in a first direction and a second row of UAVs in a second direction, wherein the second direction is 180° from the first direction. In this example, the UAVs in the second row would be expected to have a heading 180° offset from the UAVs in the first row. With this knowledge, the measured headings of the UAVs in the second row can be adjusted to allow for direct assessment of calibration errors along with the UAVs in the first row. Using these techniques, any alignment configuration of a launch pad can be adjusted for.

Figure 13:
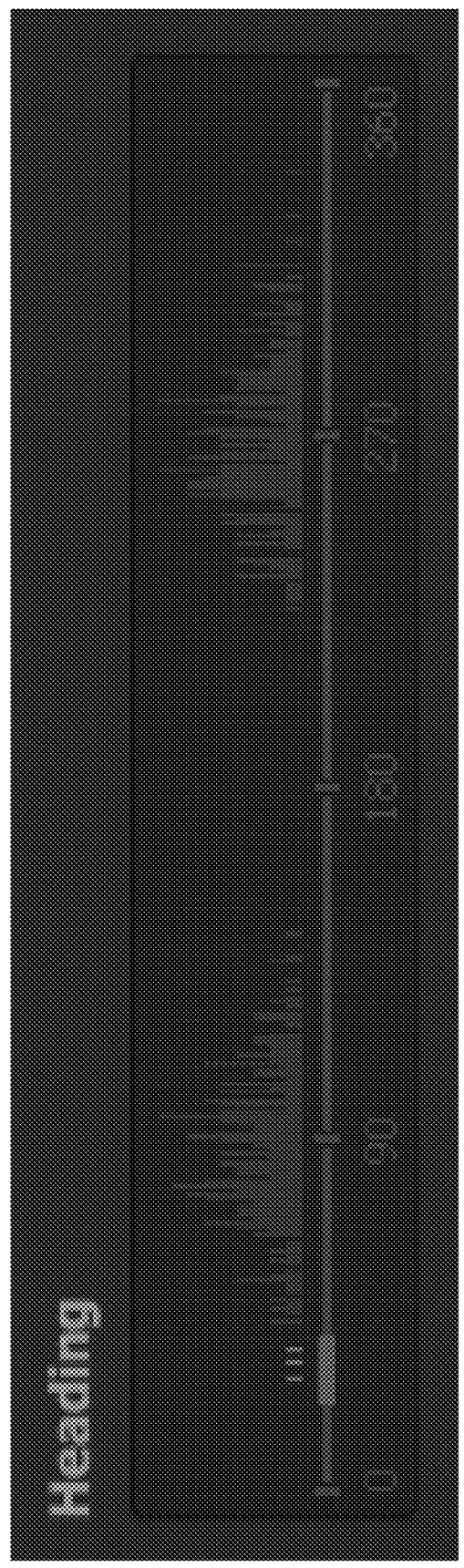
FIG. 13 depicts a device for selecting UAVs for calibration.

FIG. 13 depicts a device 1300 for selecting UAVs for calibration. When the UAVs are aligned in a consistent or known arrangement, an ideal heading for the UAVs may be obtained. As described above with respect to FIG. 10, the detected headings from the UAVs' compasses may be depicted or otherwise assessed to determine a severity of deviation from the known heading. In this case, the UAVs are arranged into, opposite-facing rows. One row is aimed at 90° (shown left), and the other row is aimed at 270° (shown right). Of the distribution on the left side, the large majority of UAVs show a heading at 90°, or within a small deviation from 90°. A predetermined threshold identifies the UAVs whose compass headings are outside of an acceptable range. In this case, the predetermined threshold is plus or minus 45°. Three UAVs are depicted as detecting a heading greater than 45° deviation from the known 90° heading. These three UAVs are selected, as indicated by the bolded horizontal line beneath them. By virtue of these UAVs being outside of the acceptable calibration tolerance, they will be selected for calibration. The calibration may be performed according to any calibration technique. According to one aspect of the disclosure, the calibration may be performed according to the methods described herein, based on at least position sensor information and accelerometer information. In using this procedure to selected UAVs in the greatest need of calibration, an unnecessary brute force calibration of all UAVs in the fleet can be avoided.

Figure 14:
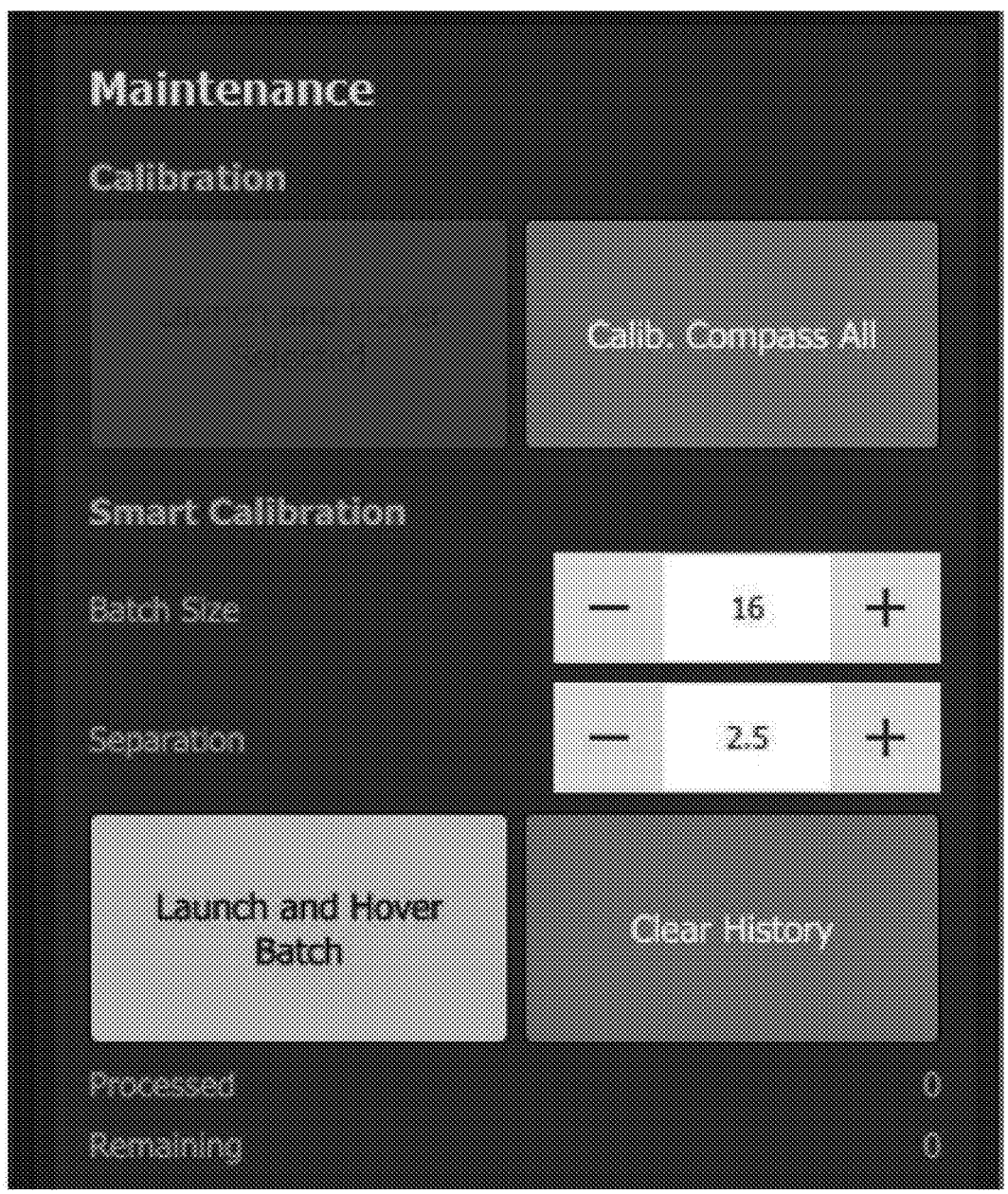
FIG. 14 depicts a device for selecting UAVs for calibration.

FIG. 14 depicts a device for selecting UAVs for calibration. Using the selection method as described above with respect to FIG. 13, one or more processors may be configured to perform an automatic calibration of the selected UAVs. This automatic calibration method may be configured as a non-transient computer readable medium or software. The automatic calibration method may be performed on any processing device or devices. According to one aspect of the disclosure, the automatic calibration method may include a graphic user interface. Said graphic user interface may be configured in any way desired, without limitation. According to one aspect of the disclosure, the graphic user interface may appear as shown in FIG. 14. In this figure, various interfaces are shown that permit automatic calibration of all or of one or more subsets of the UAVs. It may be possible to select a batch size, the batch size being a number less than all of the UAVs that will be calibrated at any given time. The batch size may be selected to provide additional room for the testing and to avoid collisions with other vehicles during the testing period. Alternatively or additionally, the interface may permit selection of a minimum separation of UAVs during testing. This minimum separation precludes UAVs less than the minimum separation distance from one another from being simultaneously tested. In the event that UAVs within the minimum separation distance are identified for testing, these UAVs will be tested in separate batches.

An unmanned aerial vehicle (UAV) is an aircraft that has the capability of autonomous flight. In autonomous flight, a human pilot is not aboard and in control of the unmanned aerial vehicle. The unmanned aerial vehicle may also be denoted as unstaffed, uninhabited or unpiloted aerial vehicle, -aircraft or -aircraft system or drone.

Figure 15:
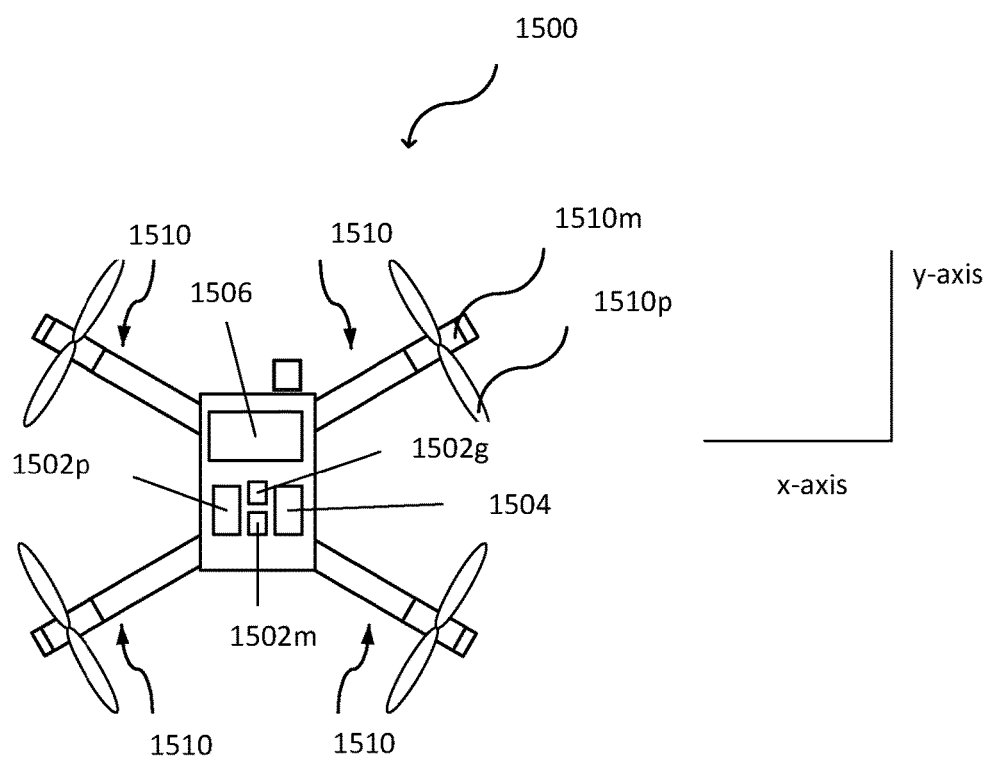
FIG. 15 depicts an unmanned aerial vehicle according to an aspect of the disclosure.

FIG. 15 illustrates an unmanned aerial vehicle 1500 in a schematic view, according to various aspects. The unmanned aerial vehicle 1500 may include a plurality of (e.g., three or more than three, e.g., four, six, eight, etc.) vehicle drive arrangements 1510. Each of the vehicle drive arrangements 1510 may include at least one drive motor 1510*m* and at least one propeller 1510*p* coupled to the at least one drive motor 1510*m*. The one or more drive motors 1510*m* of the unmanned aerial vehicle 1500 may be electric drive motors.

Further, the unmanned aerial vehicle 1500 may include one or more processors 1502*p* configured to control flight or any other operation of the unmanned aerial vehicle 1500 including but not limited to navigation, image analysis, location calculation, and any method or action described herein. One or more of the processors 1502*p* may be part of a flight controller or may implement a flight controller. The one or more processors 1502*p* may be configured, for example, to provide a flight path based at least on an actual position of the unmanned aerial vehicle 1500 and a desired target position for the unmanned aerial vehicle 1500. In some aspects, the one or more processors 1502*p* may control the unmanned aerial vehicle 1500. In some aspects, the one or more processors 1502*p* may directly control the drive motors 1510*m* of the unmanned aerial vehicle 1500, so that in this case no additional motor controller may be used. Alternatively, the one or more processors 1502*p* may control the drive motors 1510*m* of the unmanned aerial vehicle 1500 via one or more additional motor controllers. The one or more processors 1502*p* may include or may implement any type of controller suitable for controlling the desired functions of the unmanned aerial vehicle 1500. The one or more processors 1502*p* may be implemented by any kind of one or more logic circuits.

According to various aspects, the unmanned aerial vehicle 1500 may include one or more memories 1502*m*. The one or more memories may be implemented by any kind of one or more electronic storing entities, e.g. a one or more volatile memories and/or one or more non-volatile memories. The one or more memories 1502*m* may be used, e.g., in interaction with the one or more processors 1502*p*, to build and/or store image data, ideal locations, locational calculations, or alignment instructions.

Further, the unmanned aerial vehicle 1500 may include one or more power supplies 1504. The one or more power supplies 1504 may include any suitable type of power supply, e.g., a directed current (DC) power supply. A DC power supply may include one or more batteries (e.g., one or more rechargeable batteries), etc.

According to various aspects, the unmanned aerial vehicle 1500 may include one or more sensors 1506. The one or more sensors 1506 may be configured to monitor a vicinity of the unmanned aerial vehicle 1500. The one or more sensors 1506 may be configured to detect obstacles in the vicinity of the unmanned aerial vehicle 1500. The one or more sensors 1506 may include, for example, one or more cameras (e.g., a depth camera, a stereo camera, a thermal imaging camera, etc.), one or more ultrasonic sensors, etc. The unmanned aerial vehicle 1500 may further include a position detection system 1502*g*. The position detection system 1502*g* may be based, for example, on Global Positioning System (GPS) or any other available positioning system. Therefore, the one or more processors 1502*p* may be further configured to modify the flight path of the unmanned aerial vehicle 1500 based on data obtained from the position detection system 1502*g*. The sensors 1506 may be mounted as depicted herein, or in any other configuration suitable for an implementation.

According to various aspects, the one or more processors 1502*p* may include at least one transceiver configured to provide an uplink transmission and/or downlink reception of radio signals including data, e.g. video or image data and/or commands. The at least one transceiver may include a radio frequency (RF) transmitter and/or a radio frequency (RF) receiver.

The one or more processors 1502*p* may further include an inertial measurement unit (IMU) and/or a compass unit. The inertial measurement unit may allow, for example, a calibration of the unmanned aerial vehicle 1500 regarding a predefined plane in a coordinate system, e.g., to determine the roll and pitch angle of the unmanned aerial vehicle 1500 with respect to the gravity vector (e.g. from planet earth). Thus, an orientation of the unmanned aerial vehicle 1500 in a coordinate system may be determined. The orientation of the unmanned aerial vehicle 1500 may be calibrated using the inertial measurement unit before the unmanned aerial vehicle 1500 is operated in flight modus. However, any other suitable function for navigation of the unmanned aerial vehicle 1500, e.g., for determining a position, a flight velocity, a flight direction, etc., may be implemented in the one or more processors 1502*p* and/or in additional components coupled to the one or more processors 1502*p*. The IMU may include one or more magnetometers, which may be configured to measure the magnitude of a magnetic field. The measurements may be according to an x-axis, a y-axis, and/or a z-axis of the UAV. The measurements may be resolved as one or more vectors. In this figure, the x-axis and the y-axis are depicted relative to the UAV. The z-axis or yaw axis is an axis that is perpendicular to the x-axis and the a-axis, and which runs vertically through the UAV between its top and bottom.

Figure 16:
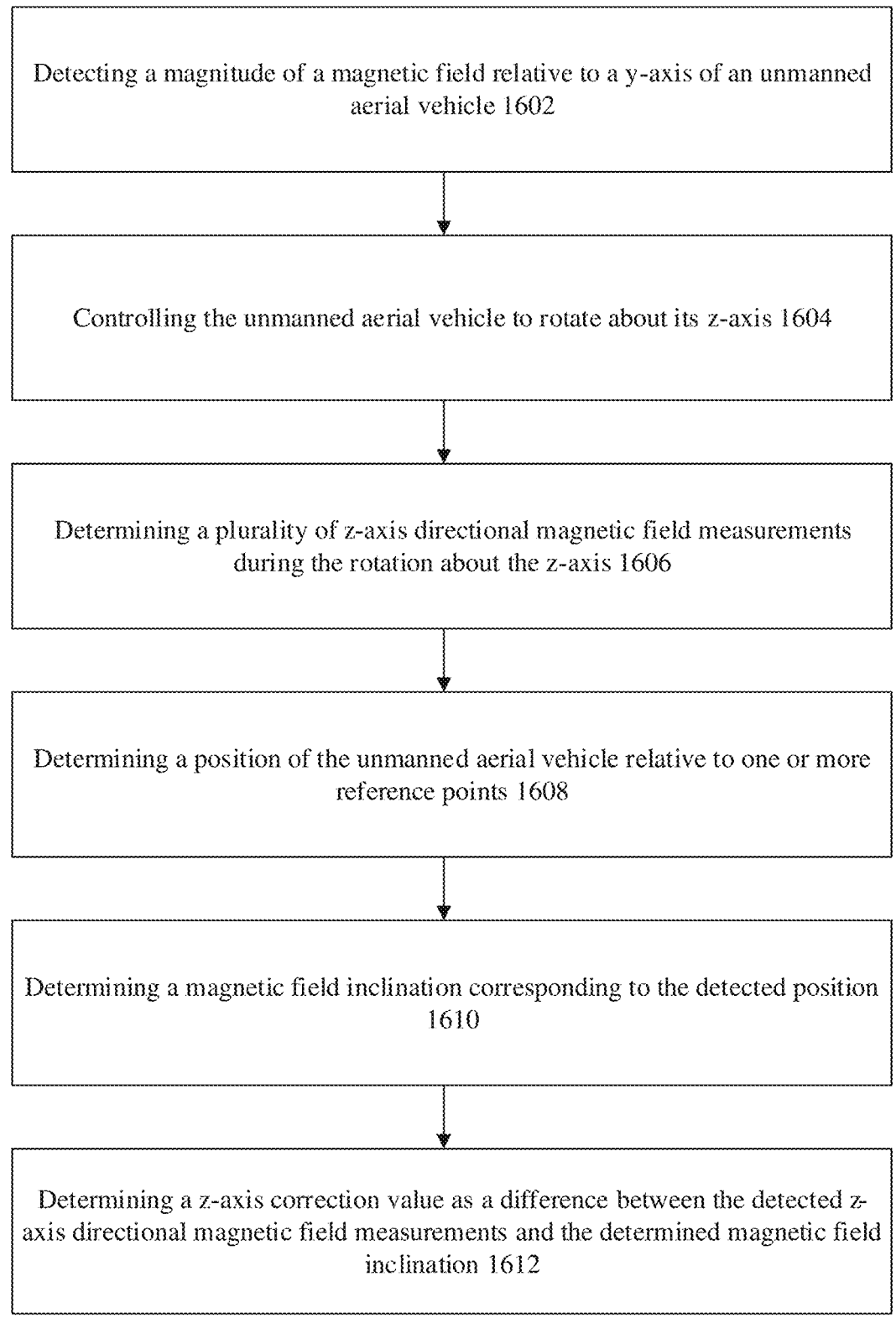
FIG. 16 depicts a method of unmanned aerial vehicle calibration.

FIG. 16 shows a first method of UAV calibration according to an aspect of the disclosure, the method comprising detecting a magnitude of a magnetic field relative to a y-axis of an unmanned aerial vehicle 1602; controlling the unmanned aerial vehicle to rotate about its z-axis 1604; determining a plurality of z-axis directional magnetic field measurements during the rotation about the z-axis 1606; determining a position of the unmanned aerial vehicle relative to one or more reference points 1608; determining a magnetic field inclination corresponding to the detected position 1610; and determining a z-axis correction value as a difference between the detected z-axis directional magnetic field measurements and the determined magnetic field inclination 1612.

Figure 17:
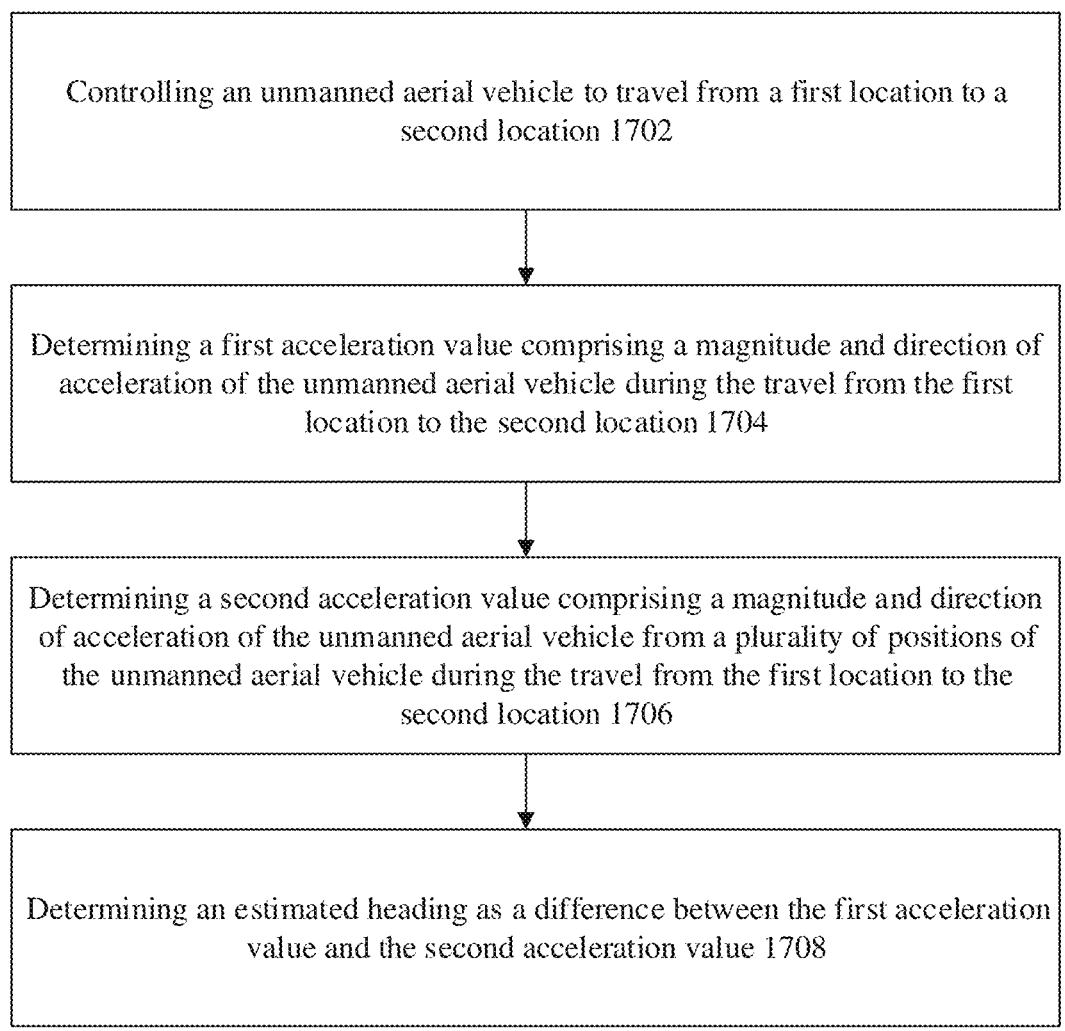
FIG. 17 depicts a method of unmanned aerial vehicle heading detection.

FIG. 17 shows a method of heading detection, comprising controlling an unmanned aerial vehicle to travel from a first location to a second location 1702; determining a first acceleration value comprising a magnitude and direction of acceleration of the unmanned aerial vehicle during the travel from the first location to the second location 1704; determining a second acceleration value comprising a magnitude and direction of acceleration of the unmanned aerial vehicle from a plurality of positions of the unmanned aerial vehicle during the travel from the first location to the second location 1706; and determining an estimated heading as a difference between the first acceleration value and the second acceleration value 1708.

Figure 18:
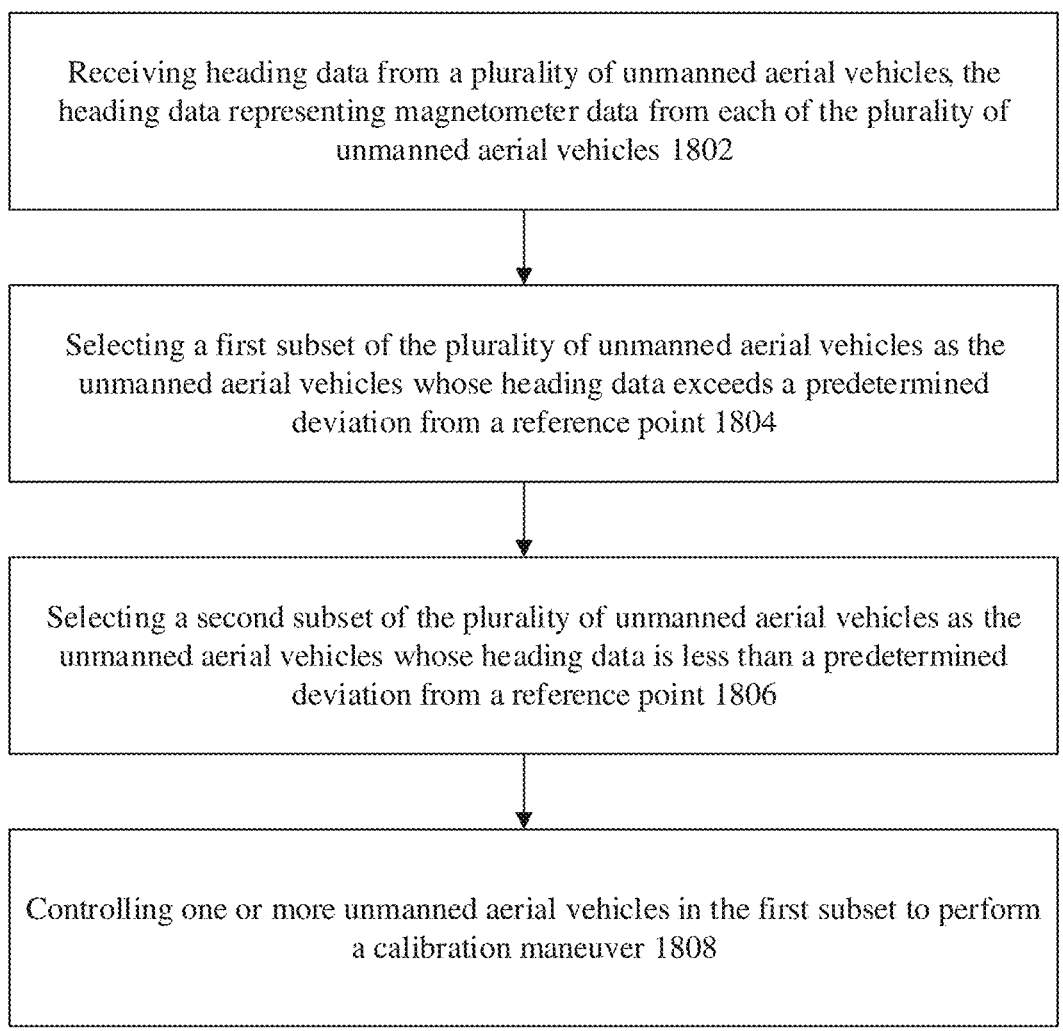
FIG. 18 depicts a method of unmanned aerial vehicle calibration selection.

FIG. 18 shows a method of UAV calibration comprising receiving heading data from a plurality of unmanned aerial vehicles, the heading data representing magnetometer data from each of the plurality of unmanned aerial vehicles 1802; selecting a first subset of the plurality of unmanned aerial vehicles as the unmanned aerial vehicles whose heading data exceeds a predetermined deviation from a reference point 1804; selecting a second subset of the plurality of unmanned aerial vehicles as the unmanned aerial vehicles whose heading data is less than a predetermined deviation from a reference point 1806; and controlling one or more unmanned aerial vehicles in the first subset to perform a calibration maneuver 1808.

Selection of UAVs for Calibration

The methods and procedures described herein may be incorporated into a device and/or procedure for automatic detection of UAVs requiring additional calibration. Furthermore, upon identifying UAVs requiring additional calibration, the calibration maneuvers described herein may be automatically or semi-automatically performed in order to rapidly achieve said calibration.

When a plurality of UAVs are deployed, one or more processors may be utilized to receive and analyze data of the plurality of UAVs. The one or more processors may be configured centrally, such as in a control center. Alternatively, the one or more processors may be distributed across multiple locations. Said one or more processors may receive data from the plurality of UAVs, including the UAVs' orientation or heading. The data may be fit using a Gaussian model, which effectively describes the most significant heading of the fleet. This data model may be presented as a histogram. The histogram may be employed as a colorized histogram.

In the context of a UAV light show, a plurality of UAVs may be used. Prior to the light show, the plurality of UAVs may be stationary and located on one or more launch pads, where the UAVs may wait at rest until deployment for the light show. One advantage of the launch pads is that they are generally configured such that a plurality of UAVs are placed in a single row along the launch pad. This results in the UAVs being placed adjacently and facing a common direction. Depending on the configuration of the launch pad, the UAVs may be placed in multiple rows and facing a common direction. Alternatively, the UAVs may be placed in multiple rows and facing opposite directions.

Assuming that the UAVs are facing a common direction (such as all UAVs facing north, or all UAVs facing west), deviations from the common heading may be deduced. That is, because it is known that the UAVs are facing a common direction, and assuming ideally calibrated compasses for each UAV, the resulting direction or heading measurements of the UAVs should be identical. Given these assumptions, any deviations in the received direction or heading measurements from the UAVs can be largely attributed to calibration errors. Said calibration errors may result, as described above, from soft iron distortions and/or hard iron distortions.

As stated above, the deviations from the known direction and heading of each UAV, said deviations being attributable to calibration error, may be ranked or mapped by magnitude. In this way, the UAVs exhibiting the greatest deviations from the known position or heading may be identified for a calibration maneuver.

Any of a variety of techniques may be employed for selecting UAVs for a calibration maneuver based on the received position or heading information. According to one aspect of the disclosure, many UAV with greater than a predetermined absolute deviation from the known position or heading may be selected for a calibration maneuver. According to another aspect of the disclosure, any UAV exhibiting greater than a predetermined percent of deviation from a known position or heading may be selected for a calibration maneuver. According to another aspect of the disclosure, any UAV exhibiting one or more standard deviations of deviation from a known position or heading may be selected for a calibration maneuver. As can be seen, any of a variety of techniques may be employed to identify fewer than all UAVs exhibiting a deviation from a known position or heading. These techniques or strategies may be employed in order to identify a subset of UAVs with a deviation from a known position or heading, so as to dedicate time and resources most efficiently to correcting the UAVs exhibiting the greatest calibration needs.

According to another aspect of the disclosure, the launch pad may be so configured that the UAVs are placed in non-uniform headings or positions. This may occur, for example, when a first group of UAVs is placed in an opposite direction from a second group of UAVs (such as a first group facing north, and a second group facing south). The UAVs may of course be placed in other relationships other than 180° from one another. Regardless of the number of subsets of UAVs placed at different orientations, or the degree of offset from one another, as long as the physical orientations of the UAVs are known, a deviation of the UAVs' compasses from the true orientation may be detected, and these deviations may be ranked or otherwise evaluated to identify a subset of UAVs for a calibration maneuver.

Given this information, the software can then deduce that all UAVs whose headings significantly deviate from the model (the principal direction) require re-calibration. An outlier-threshold can be set by the user, or UAVs can be selected manually, directly through the model. These outliers can be highlighted from the Control Center, making them flash visibly in the fleet of thousands of UAVs, such they could for example be picked out for inspection. The software can also ignore such UAVs for flights and actual shows, such that UAVs with calibration below a predetermined threshold are not used in a show. This may reduce the risk of unsafe UAVs and/or shaky images during a light show.

The user can start an automated calibration procedure, in which UAVs launch in batches to a given height, calibrate themselves, and land again. The batch size can be set by the user, in addition to a minimum safety distance between launching UAVs.

According to another aspect of the disclosure, UAVs may be selected for calibration based on a variant of iterative nearest neighbor search incorporating the batch size and pair-wise safety constraints. Using this technique, it can be ensured that batches have local coherence, allowing for the on-ground operations team to place UAVs very quickly back on their Launchpads in order to charge after calibration, rather than have the UAVs scattered across a field.

According to an aspect of the disclosure, the calibration itself may occur automatically on-board the UAV using one or more of the calibration algorithms described herein. For examine, calibration may occur automatically in a manner that requires only that the UAV rotate a full turn once around its yaw axis. In contrast, commercial and hobby UAVs require physical interaction with, and exact positioning of, the UAV along earth magnetic axes, which can be fully omitted by the approaches described herein.

According to an aspect of the disclosure, the data gathered in the procedures disclosed herein can also be used for further monitoring of long-term statistics, such as by showing how the compass calibration might be influenced over time by environmental factors (e.g. construction), weather or shifts in the earth magnetic field itself.

Further, various embodiments will be described in the following.

In Example 1, an unmanned aerial vehicle is disclosed comprising:
one or more magnetometers, configured to detect a magnetic field and to output magnetometer data corresponding to a magnitude of the detected magnetic field;

a position sensor, configured to detect a position of the unmanned aerial vehicle relative to one or more reference points, and to output position sensor data representing the detected position; one or more processors, configured to control the unmanned aerial vehicle to rotate about its z-axis; receive magnetometer data comprising a plurality of z-axis directional measurements taken during the rotation about the z-axis; receive position sensor data and determine from at least the position sensor data a magnetic field inclination of the detected position; determine a z-axis magnetometer correction value as a difference between the received magnetometer data for the z-axis and the determined magnetic field inclination.

In Example 2, the unmanned aerial vehicle of Example 1 is disclosed, wherein the one or more processors are further configured to calibrate the magnetometer by the correction value.

In Example 3, the unmanned aerial vehicle of Example 1 or 2 is disclosed, wherein the one or more processors are further configured to average the plurality of z-axis directional measurements to obtain an average magnitude of the detected magnetometer data for the z-axis, and wherein determining the z-axis magnetometer correction value as a difference between the received magnetometer data and the magnetic field inclination comprises comparing the averaged magnitude of the plurality of measurements to the magnetic field inclination.

In Example 4, the unmanned aerial vehicle of any one of Examples 1 to 3 is disclosed, wherein the one or more processors are further configured to receive magnetometer data comprising a plurality of x-axis directional measurements and y-axis directional measurements taken during the rotation about the z-axis, and to determine from the received x-axis directional measurements and y-axis directional measurements an x-axis magnetometer correction value and a y-axis magnetometer correction value.

In Example 5, the unmanned aerial vehicle of Example 4 is disclosed, wherein determining an x-axis magnetometer correction value and a y-axis magnetometer correction value comprises applying a least square ellipsoid algorithm to the received x-axis directional measurements and y-axis directional measurements.

In Example 6, the unmanned aerial vehicle of Example 5 is disclosed, wherein determining the x-axis magnetometer correction value and the y-axis magnetometer correction value further comprises determining a magnitude of offset relative to origin of an output of the least square ellipsoid algorithm.

In Example 7, the unmanned aerial vehicle of any one of Examples 4 to 6 is disclosed, wherein the one or more processors are further configured to calibrate the magnetometer by the x-axis magnetometer correction value and the y-axis magnetometer correction value.

In Example 8, the unmanned aerial vehicle of any one of Examples 4 to 7 is disclosed, wherein determining the z-axis magnetometer correction value comprises subtracting the magnetic field inclination and a value corresponding to the x-axis magnetometer correction value and the y-axis magnetometer correction value from a value representing the plurality of z-axis directional measurements.

In Example 9, the unmanned aerial vehicle of any one of Examples 1 to 8 is disclosed, wherein the one or more processors are further configured to determine the magnetic field inclination of the detected position using a look-up table.

In Example 10, the unmanned aerial vehicle of any one of Examples 1 to 9 is disclosed, further comprising a memory, wherein a plurality of magnetic field inclination values are stored on the memory, wherein each of the magnetic field inclusion values is associated with a position, and wherein the one or more processors are further configured to determine the magnetic field inclination of the detected position by locating a magnetic field indication whose position is most closely associated with the detected position.

In Example 11, the unmanned aerial vehicle of any one of Examples 1 to 10 is disclosed, wherein the rotation about its z-axis comprises 360 degrees of rotation.

In Example 12, the unmanned aerial vehicle of any one of Examples 1 to 11 is disclosed, wherein the rotation about its z-axis comprises an acceleration phase, followed by a measurement phase comprising 360 degrees of rotation, followed by a deceleration phase.

In Example 13, the unmanned aerial vehicle of any one of Examples 1 to 11 is disclosed, wherein the one or more processors are further configured to control the unmanned aerial vehicle to rotate about its z-axis at a constant velocity.

In Example 14, the unmanned aerial vehicle, comprising an accelerometer, configured to detect acceleration of the unmanned aerial vehicle and to output accelerometer data representing an acceleration vector; a position sensor, configured to detect a position of the unmanned aerial vehicle relative to one or more references points, and to output position sensor data representing the detected position and a reference time at the detected position; and one or more processors, configured to control the unmanned aerial vehicle to travel from a first location to a second location; receive position sensor data from a plurality of measurements taken during the travel from the first location to the second location; determine a first acceleration from the accelerometer data; determine a second acceleration from the position sensor data; determine an estimated heading as a difference between the first acceleration and the second acceleration.

In Example 15, the unmanned aerial vehicle of Example 14 is disclosed, further comprising an internal measurement unit (IMU), configured to determine an IMU heading of the unmanned aerial vehicle, and wherein the one or more processors are further configured to calibrate the IMU by a difference between the IMU heading and the estimated heading.

In Example 16, the unmanned aerial vehicle of Example 14 or 15 is disclosed, wherein the travel from the first location to the second location follows a straight line.

In Example 17, the unmanned aerial vehicle of Example 16 is disclosed, wherein the one or more processors are configured to determine the first acceleration from the accelerometer data corresponding to a linear acceleration between the first location and the second location.

In Example 18, the unmanned aerial vehicle of any one of Examples 14 to 17 is disclosed, wherein the one or more processors are further configured to determine the second acceleration as a second derivative of the position sensor data relative to time.

In Example 19, the unmanned aerial vehicle of Example 14 or 15 is disclosed, wherein the travel from the first location to the second location follows a circular path.

In Example 20, the unmanned aerial vehicle of Example 19 is disclosed, wherein the first direction of travel and the second direction of travel are instantaneous directions.

In Example 21, the unmanned aerial vehicle of Example 19 or 20 is disclosed, wherein the one or more processors are further configured to control the unmanned aerial vehicle to travel from the first location to the second location at a constant velocity.

In Example 22, the unmanned aerial vehicle of Example 21 is disclosed, wherein the accelerometer data correspond to accelerative force to maintain a circular path.

In Example 23, a calibration device comprising one or more processors, configured to: receive heading data from a plurality of unmanned aerial vehicles, the heading data representing magnetometer data from each of the plurality of unmanned aerial vehicles, select a first subset of the plurality of unmanned aerial vehicles as the unmanned aerial vehicles whose heading data exceeds a predetermined deviation from a reference point; select a second subset of the plurality of unmanned aerial vehicles as the unmanned aerial vehicles whose heading data is less than a predetermined deviation from a reference point; and control one or more unmanned aerial vehicles in the first subset to perform a calibration maneuver.

In Example 24, the calibration device of Example 23 is disclosed, wherein the second subset of unmanned aerial vehicles remains stationary during the calibration maneuver of the one or more unmanned aerial vehicles in the first subset.

In Example 25, the calibration device of Example 23 or 24 is disclosed, wherein the one or more processors are further configured to control fewer than all of the unmanned vehicles in the first subset to perform the calibration maneuver based on at least one of a proximity of two or more unmanned aerial vehicles in the first subset, a maximum number of unmanned aerial vehicles to perform the calibration maneuver, a predetermined number of vehicles to perform the calibration maneuver, or any combination thereof.

In Example 26, the calibration device of any one of Examples 23 to 25 is disclosed, wherein the calibration device comprises a user input device.

In Example 27, the calibration device of Example 26 is disclosed, wherein the calibration device comprises a launch pad.

In Example 28, the calibration device of any one of Examples 23 to 27 is disclosed, wherein the calibration maneuver comprises a 360-degree rotation about a z-axis of an unmanned aerial vehicle.

In Example 29, a method of calibration comprising detecting a magnitude of a magnetic field relative to a y-axis of an unmanned aerial vehicle; controlling the unmanned aerial vehicle to rotate about its z-axis; determining a plurality of z-axis directional magnetic field measurements during the rotation about the z-axis; determining a position of the unmanned aerial vehicle relative to one or more reference points; determining a magnetic field inclination corresponding to the detected position; determining a z-axis correction value as a difference between the detected z-axis directional magnetic field measurements and the determined magnetic field inclination.

In Example 30, the method of calibration of Example 29 is disclosed, further comprising calibrating the magnetometer by the correction value.

In Example 31, the method of calibration of Example 29 or 30 is disclosed, further comprising averaging the plurality of z-axis directional measurements to obtain an average magnitude of the z-axis directional magnetic field measurements; and wherein determining the z-axis magnetometer correction value comprises comparing an averaged magnitude of the plurality of measurements to the magnetic field inclination.

In Example 32, the method of calibration of any one of Examples 29 to 31 is disclosed, further comprising determining a plurality of x-axis directional measurements and y-axis directional measurements taken during the rotation about the z-axis, and determining from the x-axis directional measurements and y-axis directional measurements an x-axis magnetometer correction value and a y-axis magnetometer correction value.

In Example 33, the method of calibration of Example 32 is disclosed, wherein determining an x-axis magnetometer correction value and a y-axis magnetometer correction value comprises applying a least square ellipsoid algorithm to the received x-axis directional measurements and y-axis directional measurements.

In Example 34, the method of calibration of Example 33 is disclosed, wherein determining the x-axis magnetometer correction value and the y-axis magnetometer correction value further comprises determining a magnitude of offset relative to origin of an output of the least square ellipsoid algorithm.

In Example 35, the method of calibration of any one of Examples 32 to 34 is disclosed, further comprising calibrating a magnetometer by the x-axis magnetometer correction value and the y-axis magnetometer correction value.

In Example 36, the method of calibration of any one of Examples 32 to 35 is disclosed, wherein determining the z-axis magnetometer correction value comprises subtracting the magnetic field inclination and a value corresponding to the x-axis magnetometer correction value and the y-axis magnetometer correction value from a value representing the plurality of z-axis directional measurements.

In Example 37, the method of calibration of any one of Examples 29 to 36 is disclosed, further comprising determining the magnetic field inclination of the detected position using a look-up table.

In Example 38, the method of calibration of any one of Examples 29 to 37 is disclosed, wherein a plurality of magnetic field inclination values are stored on a memory, wherein each of the magnetic field inclusion values is associated with a position, and wherein the one or more processors are further configured to determine the magnetic field inclination of the detected position by locating a magnetic field indication whose position is most closely associated with the detected position.

In Example 39, the method of calibration of any one of Examples 29 to 38 is disclosed, wherein the rotation about its z-axis comprises 360 degrees of rotation.

In Example 40, the method of calibration of any one of Examples 29 to 39 is disclosed, wherein the rotation about its z-axis comprises an acceleration phase, followed by a measurement phase comprising 360 degrees of rotation, followed by a deceleration phase.

In Example 41, the method of calibration of any one of Examples 29 to 40 is disclosed, further comprising controlling the unmanned aerial vehicle to rotate about its z-axis at a constant velocity.

In Example 42, a method of heading detection, comprising controlling an unmanned aerial vehicle to travel from a first location to a second location; determining a first acceleration value comprising a magnitude and direction of acceleration of the unmanned aerial vehicle during the travel from the first location to the second location; determining a second acceleration value comprising a magnitude and direction of acceleration of the unmanned aerial vehicle from a plurality of positions of the unmanned aerial vehicle during the travel from the first location to the second location; determining an estimated heading as a difference between the first acceleration value and the second acceleration value.

In Example 43, the method of heading detection of Example 42 is disclosed, further comprising calibrating an Internal Measurement Unit (IMU) by a difference between an IMU heading and the estimated heading.

In Example 44, the method of heading detection of Example 42 or 43 is disclosed, wherein the travel from the first location to the second location follows a straight line.

In Example 45, the method of heading detection of Example 44 is disclosed, further comprising determining the second direction of travel from accelerometer data corresponding to a linear acceleration between the first location and the second location.

In Example 46, the method of heading detection of any one of Examples 42 to 45 is disclosed, further comprising determining acceleration as a second derivative of the plurality of positions relative to time.

In Example 47, the method of heading detection of Example 42 or 43 is disclosed, wherein the travel from the first location to the second location follows a circular path.

In Example 48, the method of heading detection of Example 47 is disclosed, wherein the first direction of travel and the second direction of travel are instantaneous directions.

In Example 49, the method of heading detection of Example 47 or 48 is disclosed, further comprising controlling the unmanned aerial vehicle to travel from the first location to the second location at a constant velocity.

In Example 50, the method of heading detection of Example 49 is disclosed, wherein the accelerometer data correspond to accelerative force to maintain a circular path.

In Example 51, a method of calibration is disclosed comprising receiving heading data from a plurality of unmanned aerial vehicles, the heading data representing magnetometer data from each of the plurality of unmanned aerial vehicles, selecting a first subset of the plurality of unmanned aerial vehicles as the unmanned aerial vehicles whose heading data exceeds a predetermined deviation from a reference point; selecting a second subset of the plurality of unmanned aerial vehicles as the unmanned aerial vehicles whose heading data is less than a predetermined deviation from a reference point; and controlling one or more unmanned aerial vehicles in the first subset to perform a calibration maneuver.

In Example 52, the method of calibration of Example 51 is disclosed, wherein the second subset of unmanned aerial vehicles remains stationary during the calibration maneuver of the one or more unmanned aerial vehicles in the first subset.

In Example 53, the method of calibration of Example 51 or 52 is disclosed, further comprising controlling fewer than all of the unmanned vehicles in the first subset to perform the calibration maneuver based on at least one of a proximity of two or more unmanned aerial vehicles in the first subset, a maximum number of unmanned aerial vehicles to perform the calibration maneuver, a predetermined number of vehicles to perform the calibration maneuver, or any combination thereof.

In Example 54, the method of calibration of any one of Examples 51 to 53 is disclosed, wherein the calibration maneuver comprises a 360-degree rotation about a z-axis of an unmanned aerial vehicle.

In Example 55, one or more non-transient computer readable media, configured to cause one or more processors when executed to perform the method of any one of Examples 29 to 54.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An unmanned aerial vehicle comprising:
   one or more magnetometers, configured to detect a magnetic field and to output magnetometer data corresponding to a magnitude of the detected magnetic field;
   a position sensor, configured to detect a position of the unmanned aerial vehicle relative to one or more reference points, and to output position sensor data representing the detected position;
   one or more processors, configured to:
   control the unmanned aerial vehicle to rotate about its z-axis;
   receive magnetometer data comprising a plurality of z-axis directional measurements taken during the rotation about the z-axis;
   receive position sensor data and determine from at least the position sensor data a magnetic field inclination of the detected position;
   determine a z-axis magnetometer correction value as a difference between the received magnetometer data for the z-axis and the determined magnetic field inclination;
   wherein the one or more processors are further configured to receive magnetometer data comprising a plurality of x-axis directional measurements and y-axis directional measurements taken during the rotation about the z-axis, and to determine from the received x-axis directional measurements and y-axis directional measurements an x-axis magnetometer correction value and a y-axis magnetometer correction value;
   wherein determining the z-axis magnetometer correction value comprises determining the z-axis magnetometer correction value based on the magnetic field inclination, a value corresponding to the x-axis magnetometer correction value, a value corresponding to the y-axis magnetometer correction value, and the plurality of z-axis directional measurements.

2. The unmanned aerial vehicle of claim 1, wherein the one or more processors are further configured to calibrate the magnetometer by the correction value.

3. The unmanned aerial vehicle of claim 1, wherein the one or more processors are further configured to average the plurality of z-axis directional measurements to obtain an average magnitude of the detected magnetometer data for the z-axis, and wherein determining the z-axis magnetometer correction value as a difference between the received magnetometer data and the magnetic field inclination comprises comparing the averaged magnitude of the plurality of measurements to the magnetic field inclination.

4. A method of calibration comprising
   detecting a magnitude of a magnetic field relative to a y-axis of an unmanned aerial vehicle;
   controlling the unmanned aerial vehicle to rotate about its z-axis;
   determining a plurality of z-axis directional magnetic field measurements during the rotation about the z-axis;
   determining a position of the unmanned aerial vehicle relative to one or more reference points;
   determining a magnetic field inclination corresponding to the detected position;

determining a z-axis correction value as a difference between the detected z-axis directional magnetic field measurements and the determined magnetic field inclination;

further comprising taking a plurality of x-axis directional measurements and y-axis directional during the rotation about the z-axis, and determining from the received x-axis directional measurements and y-axis directional measurements an x-axis magnetometer correction value and a y-axis magnetometer correction value;

wherein determining the z-axis magnetometer correction value comprises determining the z-axis magnetometer correction value based on the magnetic field inclination, a value corresponding to the x-axis magnetometer correction value, a value corresponding to the y-axis magnetometer correction value, and the plurality of z-axis directional measurements.

5. The method of calibration of claim 4, further comprising calibrating the magnetometer by the correction value.

6. The method of calibration of claim 4, further comprising averaging the plurality of z-axis directional measurements to obtain an average magnitude of the z-axis directional magnetic field measurements; and wherein determining the z-axis magnetometer correction value comprises comparing an averaged magnitude of the plurality of measurements to the magnetic field inclination.

* * * * *